United States Patent
Hasegawa et al.

(10) Patent No.: US 7,332,859 B2
(45) Date of Patent: Feb. 19, 2008

(54) ORGANIC LUMINESCENCE DEVICE WITH ANTI-REFLECTION LAYER AND ORGANIC LUMINESCENCE DEVICE PACKAGE

(75) Inventors: Toshinori Hasegawa, Kanagawa (JP); Shuichi Kobayashi, Kanagawa (JP); Hikaru Hoshi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/231,851

(22) Filed: Sep. 22, 2005

(65) Prior Publication Data

US 2006/0017374 A1 Jan. 26, 2006

Related U.S. Application Data

(62) Division of application No. 11/099,623, filed on Apr. 6, 2005, now Pat. No. 7,187,121, and a division of application No. 10/406,273, filed on Apr. 4, 2003, now abandoned.

(30) Foreign Application Priority Data

| Apr. 9, 2002 | (JP) | 2002-106903 |
| Apr. 9, 2002 | (JP) | 2002-106904 |
| Apr. 9, 2002 | (JP) | 2002-106905 |

(51) Int. Cl.
*H01J 1/62* (2006.01)
*H01J 63/04* (2006.01)

(52) U.S. Cl. ............... 313/504; 313/498; 313/506; 313/512

(58) Field of Classification Search ............... 313/498, 313/501, 504, 506, 112, 609
See application file for complete search history.

(56) References Cited

U.S. PATENT DOCUMENTS

| 5,952,778 | A | 9/1999 | Haskal et al. ............. 313/504 |
| 6,150,187 | A | 11/2000 | Zyung et al. ................ 438/26 |
| 6,198,217 | B1 | 3/2001 | Suzuki et al. ............. 313/504 |
| 6,210,815 | B1 | 4/2001 | Ooishi ....................... 428/690 |
| 6,280,559 | B1 | 8/2001 | Terada et al. ............. 156/295 |
| 6,285,039 | B1 | 9/2001 | Kobori et al. ................ 257/40 |
| 6,551,724 | B2 | 4/2003 | Ishii et al. ................. 428/690 |
| 6,575,800 | B1 | 6/2003 | Kobayashi et al. ........... 445/24 |
| 6,646,373 | B1 | 11/2003 | Su ............................. 313/512 |
| 6,692,326 | B2 | 2/2004 | Choi et al. ................... 445/24 |
| 6,762,553 | B1 | 7/2004 | Yokogawa et al. ......... 313/509 |
| 6,985,275 | B2 | 1/2006 | Miyazawa ................. 359/245 |
| 2004/0140758 | A1* | 7/2004 | Raychaudhuri et al. ..... 313/504 |

FOREIGN PATENT DOCUMENTS

| EP | 1154676 A1 * | 11/2001 |
| JP | 07-142169 | 6/1995 |

(Continued)

*Primary Examiner*—Nimeshkumar D. Patel
*Assistant Examiner*—Kevin Quarterman
(74) *Attorney, Agent, or Firm*—Fitzpatrick, Cella, Harper & Scinto

(57) ABSTRACT

For realizing an organic luminescence device of a high efficiency, the present invention provides an organic luminescence device having an anti-reflection film on a transparent electrode or on a moisture prevention layer.

13 Claims, 9 Drawing Sheets

FOREIGN PATENT DOCUMENTS

| | | |
|---|---|---|
| JP | 07-211458 | 8/1995 |
| JP | 08-008065 | 1/1996 |
| JP | 08-222374 | 8/1996 |
| JP | 10-214043 | 8/1998 |
| JP | 11-191491 | 7/1999 |
| JP | 2000-273618 | 10/2000 |
| JP | 2000-353594 | 12/2000 |
| JP | 2001-043980 | 2/2001 |
| JP | 2002/076884 | 3/2001 |
| JP | 2001-230072 | 8/2001 |
| JP | 2001-332391 | 11/2001 |
| JP | 2003-234179 | 8/2003 |
| JP | 2003-249353 | 9/2003 |
| KR | 2001/0068549 | 7/2001 |

\* cited by examiner

ORGANIC LUMINESCENCE DEVICE WITH ANTI-REFLECTION LAYER AND ORGANIC LUMINESCENCE DEVICE PACKAGE

CROSS-REFERENCE TO RELATED APPLICATIONS

This application is a division of application Ser. No. 11/099,623, filed Apr. 6, 2005 now U.S. Pat. No. 7,187,121, which in turn, is a division of application Ser. No. 10/406,273, filed Apr. 4, 2003 now abandoned.

BACKGROUND OF THE INVENTION

1. Field of the Invention

The present invention relates to an organic luminescence device having at least an organic compound layer between an anode and a cathode, and an organic luminescence device array and an organic luminescence device package.

2. Related Background Art

An organic luminescence device means a so-called organic electroluminescence device in which a current flowing between a cathode and an anode causes light emission of an organic compound present between the electrodes.

(First Background Art)

FIG. 1 shows a general cross-sectional structure of an organic luminescence device, in which shown are a substrate 1, an electrode 2, a hole transporting layer 3, a light emitting layer 4, an electron injecting layer 5, and a transparent electrode 6.

In such organic luminescence device, electrons injected from the transparent electrode 6 through the electron injecting layer 5 into the light emitting layer 4 combine with positive holes injected from the electrode 2 through the hole transporting layer 3 into the light emitting layer 4 to form excitons, and the device utilizes light emitted when the excitons return to a ground state. The light is emitted to the exterior through the transparent electrode 6.

(Second Background Art)

FIG. 2 shows a general cross-sectional structure of an organic luminescence device array having a plurality of such organic luminescence devices, in which shown are a substrate 1, an electrode 2, a hole transporting layer 3, a light emitting layer 4, an electron injecting layer 5, and a transparent electrode 6, an insulating member 7 provided in an isolating area present between the respective organic luminescence devices, a wiring 8 connected to the electrode 2 of each organic luminescence device, and a resinous member 9. FIG. 2 shows a device having five organic luminescence devices as an example, but the number of the organic luminescence devices provided in an array device can be arbitrarily selected.

(Third Background Art)

FIG. 3 shows a general cross-sectional structure of an organic luminescence device and a package therefor, in which shown are a substrate 1, an electrode 2, a hole transporting layer 3, a light emitting layer 4, an electron injecting layer 5, and a transparent electrode 6 and a case 14 for accommodating the organic luminescence device.

In such organic luminescence device, electrons injected from the transparent electrode 6 through the electron injecting layer 5 into the light emitting layer 4 combine with positive holes injected from the electrode 2 through the hole transporting layer 3 into the light emitting layer 4 to form excitons, and the device utilizes light emitted when the excitons return to a ground state.

(Drawbacks Associated with the First Background Art)

In such organic luminescence device, the transparent electrode 6 is formed by a material of a refractive index higher than that of air or nitrogen, constituting the external environment of the organic luminescence device. Therefore, the light emitted from the light emitting layer 4 is reflected at a light emitting surface of the transparent electrode 6, namely at the interface between the transparent electrode and the air constituting the external environment in FIG. 1. For this reason, such organic luminescence device has been associated with a low efficiency of light emission to the exterior, and, in case of employing a transparent electrode 6 formed by a material of such high refractive index, an external light falling on the organic luminescence device from the external environment is reflected at the interface of the transparent electrode 6 and the external environment, whereby, even if the other electrode 2 formed at the substrate side is provided with means for preventing reflection of the external light, the external light is reflected on the surface of the transparent electrode 6 to cause a mixing of the light emitted by the device and the reflected light of the external light thereby lowering the contrast of the organic luminescence device. Also in case a passivation film such as a SiN film for moisture prevention is formed on the transparent electrode 6, a similar drawback is encountered because of a large difference in the refractive index between the SiN film and the air.

(Drawback Associated with the Second Background Art)

In an organic luminescence device array having a plurality of such organic luminescence devices, there is formed a wiring connected to the electrode of each organic luminescence device, in an isolation area of the organic luminescence devices and under the organic luminescence devices. In case an insulating member 7 provided in such isolation area and a resinous member 9 on the substrate 1 are light transmissible, the external light entering the organic luminescence device array from the external environment is transmitted by the insulating member 7 in the isolation area and the resinous member 9 and is reflected by the wiring 8. Also the external light may be reflected by such insulating member 7 or resinous member 9. The light reflected in these portions is mixed with the light emitted from the organic luminescence device to lower the contrast thereof, whereby an image displayed by the device is deficient in visibility.

Also in a package accommodating the aforementioned organic luminescence device array in a case, in order to avoid the aforementioned drawback of the contrast loss by the reflection of the external light, it is necessary to form a polarizing layer on a light emitting face of the case. For this reason, the package of such organic luminescence device array is also associated with a drawback that the manufacture is complex and expensive.

(Drawback Associated with the Third Background Art)

In a package of such organic luminescence device, the light emitted from the light emitting layer 4 is transmitted by the transparent electrode 6, and enters the light emitting face of the case 14 through an unrepresented atmospheric gas such as air or nitrogen. The case 14 is generally formed with a material such as glass or resin, of which refractive index is higher than of the atmospheric gas present between the organic luminescence device and the case. Therefore, the light emitted from the light emitting layer 4 is partly reflected at the interface between the atmospheric gas and the light entering face of the case 14. For this reason, such package of the organic luminescence device has been associated with a low efficiency of light emission to the exterior.

Similarly, the transparent electrode 6 has a refractive index higher than that of the unrepresented atmospheric gas. Therefore, the light emitted from the light emitting layer 4 is partly reflected at the interface between the transparent electrode 6 and the atmospheric gas, and such package of the organic luminescence device has been associated with a low efficiency of light emission to the exterior.

Furthermore, for the case 14, the material constituting the case 14 has a refractive index higher than that of the air constituting the external environment of the package, whereby the light from the external environment (external light) is reflected on the face of the case 14, emitting the light. For this reason, the light emitted from the device is mixed with the external light at the interface between the external environment and the case 14, whereby the organic luminescence package itself has a low contrast.

SUMMARY OF THE INVENTION

In consideration of the foregoing, the present invention is to provide an organic luminescence device of a high light-emitting efficiency to the exterior and an organic luminescence device of a satisfactory contrast.

More specifically, the present invention provides an organic luminescence device having at least a pair of mutually opposed electrodes and an organic compound layer provided between the paired electrodes, wherein the organic luminescence device includes an anti-reflection layer on a transparent electrode on the light-emitting side of the electrodes.

Also, the present invention provides an organic luminescence device having at least a pair of mutually opposed electrodes and an organic compound layer provided between the paired electrodes, wherein the pair of electrodes are constituted by an electrode provided on the side of a substrate and a transparent electrode constituting the other electrode, and the organic luminescence device includes a moisture preventing layer on the transparent electrode and an anti-reflection layer on the moisture preventing layer.

Also the present invention provides an organic luminescence device array having, on a substrate, a plurality of organic luminescence devices separated by isolation areas and each having a pair of mutually opposed electrodes and an organic compound layer formed between the paired electrodes, wherein the array includes a wiring connected to the organic luminescence device under the organic luminescence device and in the isolation area, and, in the isolation area on the wiring, a member which intercepts external light entering the organic luminescence device from the exterior and has a reflectance to the external light lower than that of the wiring.

Also the present invention provides an organic luminescence device array having, on a substrate, a plurality of organic luminescence devices separated by isolation areas and each having a pair of mutually opposed electrodes and an organic compound layer formed between the paired electrodes, wherein the array includes a wiring, connected to the organic luminescence device, under the organic luminescence device and in the isolation area and a member bearing such wiring, and, such member intercepts external light entering the organic luminescence device from the exterior and has a reflectance to the external light lower than that of the wiring.

Also the present invention provides a package for an organic luminescence device with a high light-emitting efficiency to the exterior.

More specifically, the present invention provides a package for an organic luminescence device including:

an organic luminescence device having a pair of electrodes mutually opposed on a substrate, and an organic layer formed between the paired electrodes, and a case holding the organic luminescence device in an internal holding space, in which a light emitted from the organic luminescence device is emitted to the exterior through a light emitting side of the case;

wherein anti-reflection means is provided on a light-emitting face on the light-emitting side among faces constituting the internal holding space of the case.

DETAILED DESCRIPTION OF THE PREFERRED EMBODIMENTS

First Embodiment

Figure 1:
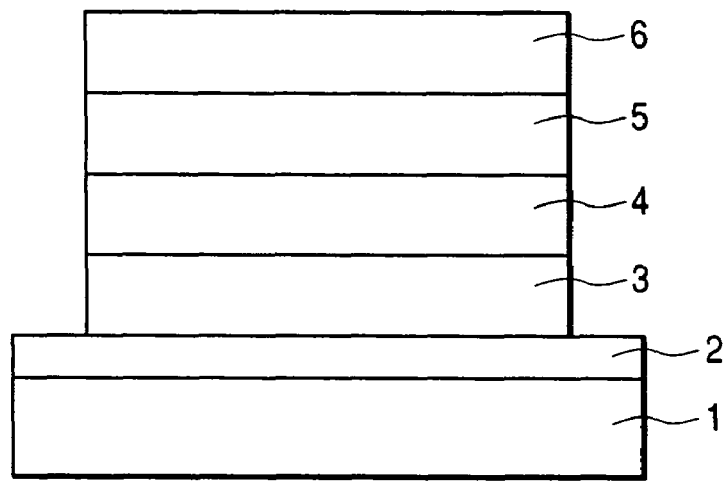
FIG. 1 is a schematic view showing a multilayer structure of an organic luminescence device of the background art.
Figure 2:
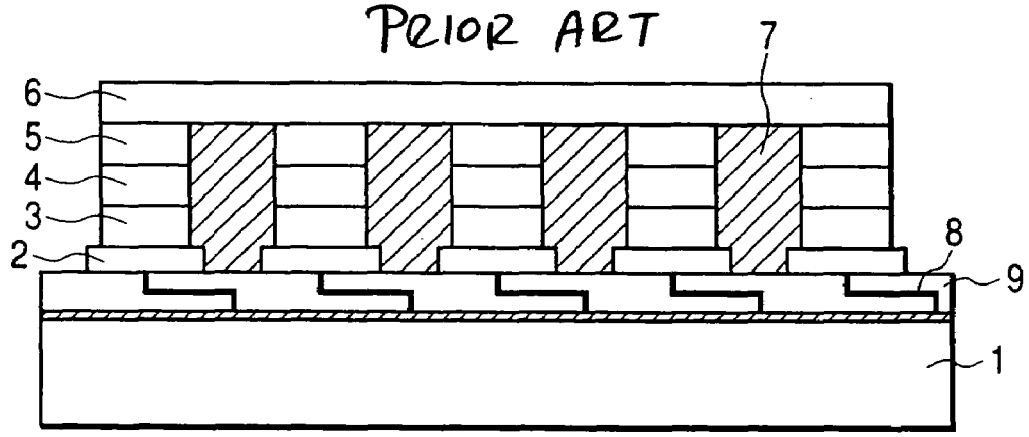
FIG. 2 is a schematic view showing a structure of an organic luminescence device array of the background art.
Figure 3:
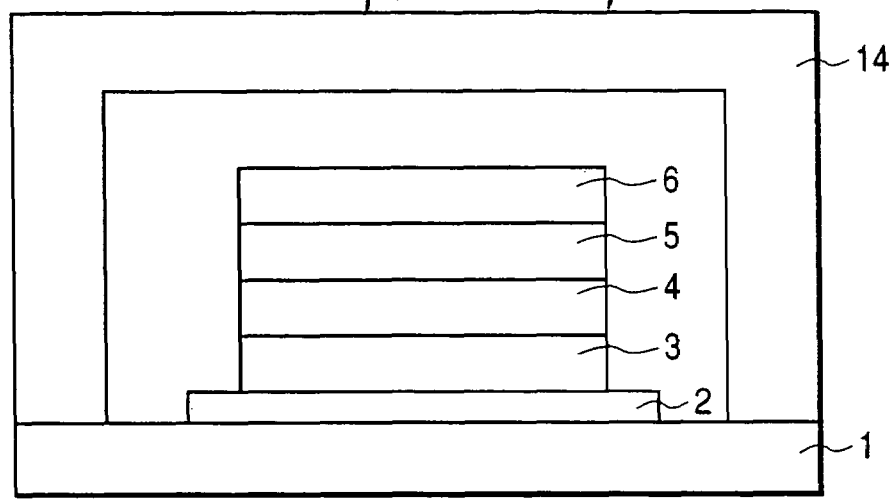
FIG. 3 is a schematic view showing a structure of an organic luminescence device package of the background art.
Figure 4:
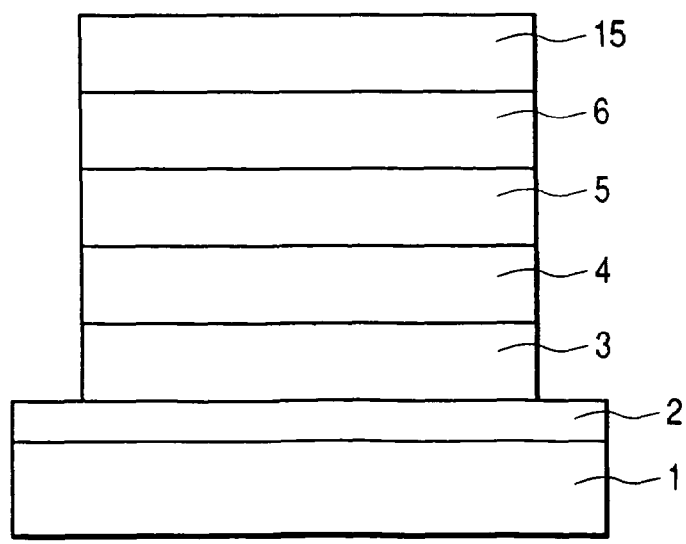
FIG. 4 is a schematic view showing a multilayer structure of an organic luminescence device of the present invention.

An organic luminescence device according to a first embodiment of the present invention is provided with an anti-reflection layer 15 on a transparent electrode 6 serving as a light-emitting electrode. Such anti-reflection layer may be of a single layer type or a multi layer type. FIG. 4 is a schematic cross-sectional view of an organic luminescence device of the first embodiment of the present invention, in which provided are a substrate 1, an electrode 2, a hole transporting layer 3, a light emitting layer 4, an electron injecting layer 5, a transparent electrode 6, and an anti-reflection layer 15 to constitute an organic luminescence device of so-called top emission type.

The anti-reflection layer prevents the reflection of the light emitted from the light emitting layer at the interface between the transparent electrode 6 and the external environment in which the organic luminescence device is present, thereby improving the light-emission efficiency of the device.

The external environment means ordinary air, air with a reduced content of oxygen or moisture, or an inert gas such as nitrogen.

In this embodiment, the anti-reflection layer may be of a single layer type or a multi layer type. An example of a particularly preferably employable material is $SiO_2$. The organic compound can be a known one such as Alq3 or α-NPD.

Also the organic layer between the electrodes can be, in addition to the foregoing, of plural layers such as a three-layer or five-layer structure. Also the organic luminescence device of the present embodiment may be applied to a display apparatus capable of full-color display, constituted by light-emitting devices of RGB colors. More specifically, it may be applied to a display unit of a display device. The organic luminescence device of the present embodiment may be applied, among such display devices, to a pixel unit (light-emitting unit) of a display panel of so-called active matrix drive, utilizing TFTs.

Second Embodiment

Figure 5:
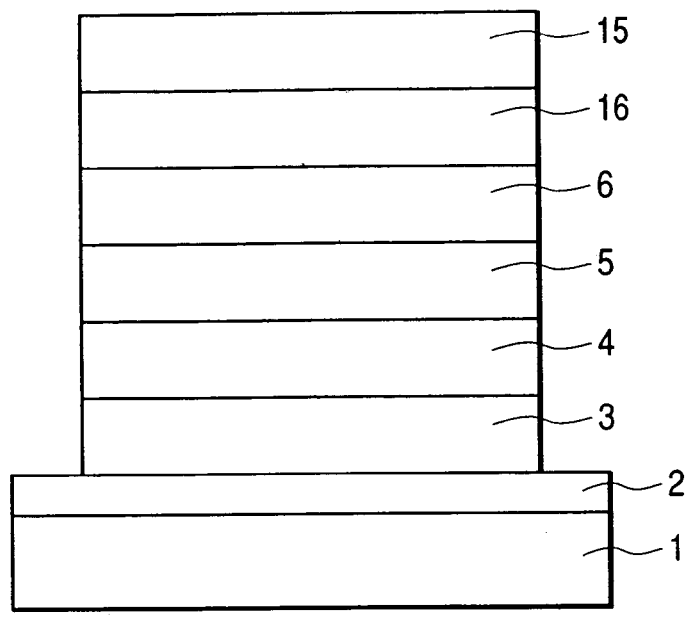
FIG. 5 is a schematic view showing a multilayer structure of an organic luminescence device of the present invention.

An organic luminescence device according to a second embodiment of the present invention includes, in an organic luminescence device having a moisture preventing layer on the transparent electrode 6 serving as the light-emitting electrode, an anti-reflection layer on such moisture preventing layer. Other configurations are the same as those in the first embodiment. FIG. 5 is a schematic cross-sectional view of an organic luminescence device of the second embodiment of the present invention, in which provided are a substrate 1, an electrode 2, a hole transporting layer 3, a light emitting layer 4, an electron injecting layer 5, a transparent electrode 6, an anti-reflection layer 15, and a moisture preventing layer 16, to constitute an organic luminescence device of so-called top emission type.

The anti-reflection layer prevents the reflection of the light emitted from the light emitting layer at the interface between the moisture preventing layer 16 and the external environment in which the organic luminescence device is present, thereby improving the light-emission efficiency of the device.

Third Embodiment

Figure 6:
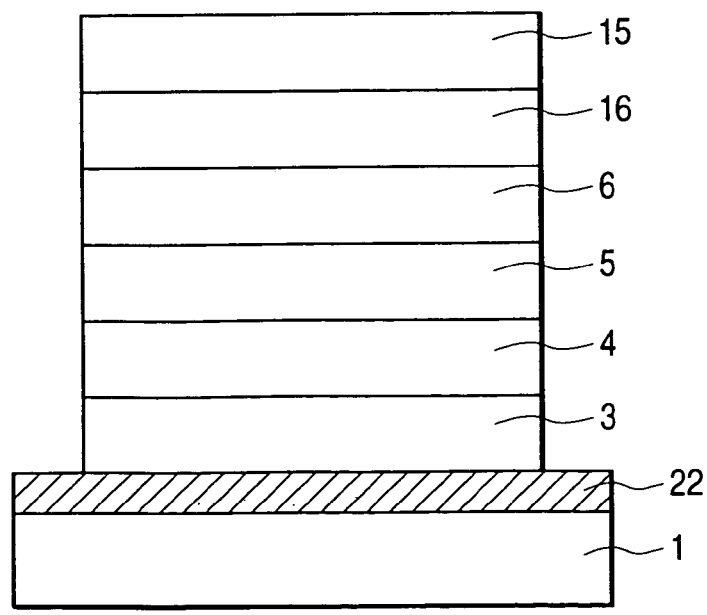
FIG. 6 is a schematic view showing a multilayer structure of an organic luminescence device of the present invention.

An organic luminescence device according to a third embodiment of the present invention utilizes, as an electrode provided at the substrate side, an electrode capable of preventing reflection of a light entering the device from the exterior, utilizing light absorption or by light interference. Other configurations are the same as those in the second embodiment. FIG. 6 is a schematic cross-sectional view of an organic luminescence device of the third embodiment of the present invention, in which provided are a substrate 1, an electrode 22 which intercepts the external light and prevents reflection thereof, a hole transporting layer 3, a light emitting layer 4, an electron injecting layer 5, a transparent electrode 6, an anti-reflection layer 15, and a moisture preventing layer 16, to constitute an organic luminescence device of so-called top emission type.

Thus, the organic luminescence device of the present embodiment is applicable also to an organic luminescence device utilizing, as the electrode at the substrate side, an electrode which is so constructed as to prevent reflection of the external light. Also since the anti-reflection layer prevents reflection of the emitted light as well as the external light at the interface between the organic luminescence device and the external environment, the present embodiment provides a higher light-emitting efficiency in comparison with other embodiments and can provide an organic luminescence device of a very high contrast.

The light-emission efficiency of the foregoing embodiments in the configurations shown in FIGS. 4 to 6 can be estimated as follows.

Light reflection becomes larger and light transmission is lowered at an interface where the constituting materials thereof show a larger difference in the refractive indexes. More specifically, at the interface between the transparent electrode 6 and the light emission space, for an ITO transparent electrode with a refractive index n6=2.0 and a space of nitrogen or air with a refractive index nk=1, the reflectance is given by $(n6-nk)^2/(n6+nk)^2$ and gives a reflection loss of about 11%.

In a device of a configuration having the moisture preventing layer 16 on the transparent electrode 6, the moisture preventing layer 16 formed for example by SiN has a reflective index n8 of about 2.3. The difference in the refractive indexes between the transparent electrode 6 and the moisture preventing layer 16 is as small as about 0.3 which only causes a small reflection loss of 0.5% in a similar estimation, but the reflection loss at the interface between the moisture preventing layer 16 and the light emission space, given by $(n8-nk)^2/(n8+nk)^2$, amounts to about 15.5%.

Thus, for improving the light-emission efficiency, it is necessary to suppress the reflection loss and to improve the transmittance of light emitted from the light emitting layer 4 to the upper space through the transparent electrode 6 or the moisture preventing layer 16.

An anti-reflection film is effective for suppressing the reflection loss. A known anti-reflection film utilizes a transparent material of a large refractive index such as ZnS, $CeO_2$ or $TiO_2$ and a material of a small refractive index such as LiF, $CaF_2$, $MgF_2$ or $SiO_2$ and is formed by alternately laminating the material of a larger refractive index and the material of a smaller refractive index (with mutually different refractive indexes) with each thickness obtained by dividing a design wavelength with (4× refractive index of material). In such configuration, it is necessary to employ a material of a refractive index smaller than that of a material constituting the interface, as the material of the smaller refractive index in the anti-reflection film. For example, a three-pair anti-reflection film employing NaF or LiF (smaller refractive index) and TiO$_2$ (larger refractive index) (for example, case surface/LiF/TiO$_2$/LiF/TiO$_2$/LiF/TiO$_2$) allows to reduce the above-mentioned interfacial reflection loss to $1/10$ or less.

In case the anti-reflection film 15 has a single layer structure, there is selected a material having a refractive index lower than that of the material constituting the interfacial layer of which reflection loss is to be suppressed.

A contrast of a device can be evaluated by a following formula:

$$C = 1 + B/(\gamma \times A)$$

wherein C is a contrast evaluation value, A is luminosity (ft-L) of external light, B is luminosity (ft-L) of the device, and γ is reflectance (%) of the entire device.

It is therefore necessary to observe the device in a darker place (A) with a lowered reflectance (γ) and with a higher luminosity.

In practice, a difficulty may arise in an outdoor use. The luminosity of the external light may become several to ten and several times of that of the device.

The reflection loss, which lowers the transmission, also reduces the contrast. In the absence of the aforementioned anti-reflection film, because of a reflection of the external light of about 11 to 16%, the contrast value becomes 10 or less even under the external light of a luminosity comparable to that of the device. On the other hand, the presence of the aforementioned anti-reflection film, capable of reducing the reflection of the external light to about 1%, can provide a satisfactory contrast value close to 100. However, in case the electrode 2 has a high reflectance (for example 20% or higher), a sufficient improvement in contrast cannot be attained due to the reflection of the external light by the electrode 2. A reflection of the external light of 1% or less in the entire device can be attained by employing an electrode 22 capable of intercepting the external light and preventing the reflection of the external light (reflectance about 1%) as shown in FIG. 6.

EXAMPLES

In the following, there will be explained, with reference to the accompanying drawings, preferred examples of the method for producing the organic luminescence device of the present invention, but the present invention is not limited by such examples.

Example 1

FIG. 4 shows a first example, in which shown are a substrate 1, an electrode 2, a hole transporting layer 3, a light emitting layer 4, an electron injecting layer 5, a transparent electrode 6, and an anti-reflection layer 15.

On the substrate 1, a chromium film was formed by sputtering to obtain the electrode 2. Then the substrate was subjected to ultrasonic rinsing in succession with acetone and isopropyl alcohol (IPA), then washed by boiling in IPA and dried. It was further subjected to UV/ozone washing.

Then a vacuum evaporation apparatus (manufactured by Shinku Kikou Co.) was used to form, on the substrate after washing, a film of αNPD having a hole transporting property and represented by a following chemical formula I

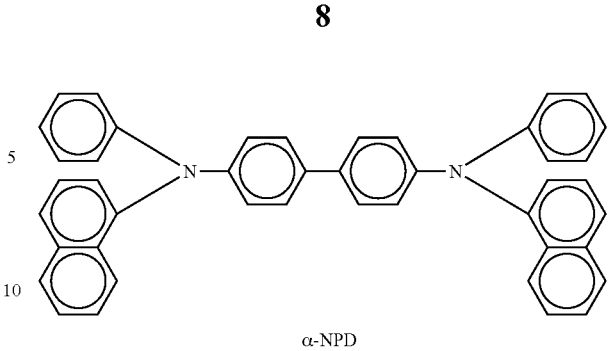

α-NPD by vacuum evaporation to form the hole-transporting layer 3. The film formation was conducted under a vacuum of $1.0 \times 10^{-6}$ Torr, and a film forming rate of 0.2-0.3 nm/sec. Then, on the hole-transporting layer 3, a film of an aluminum chelate (hereinafter called Alq3) represented by the following chemical formula:

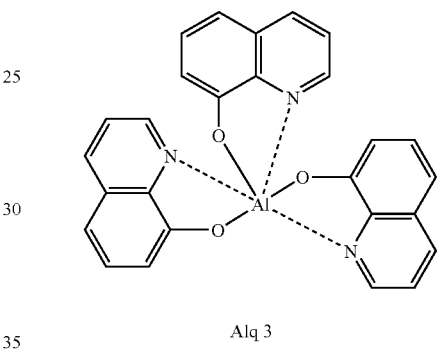

Alq 3 was formed by vacuum evaporation under the same conditions as those in the formation of the hole-transporting layer 3, thereby obtaining a light-emitting layer 4. Then, on the light-emitting layer 4, a film of aluminum-lithium as the electron-injecting layer 5 was formed by vacuum evaporation under the same conditions as those in the formation of the hole-transporting layer 3. Thereafter, on the electron-injecting layer 5, a film of tin indium oxide (ITO) was formed by sputtering to obtain the transparent electrode 6. Finally, on the transparent electrode 6, a film of SiO$_2$ was formed by sputtering as an anti-reflection film (layer).

In this manner an organic luminescence device was prepared on the substrate 1, by forming the electrode 2, the hole-transporting layer 3, the light-emitting layer 4, the electron-injecting layer 5, the transparent electrode 6, and the anti-reflection layer 15.

Subsequently, a DC voltage was applied to the organic luminescence device in order to investigate the light emission characteristics thereof. As a result, it was confirmed that this device had an improved light-emitting efficiency in comparison with a device which is not provided with the anti-reflection layer 15 on the transparent electrode 6.

Example 2

FIG. 5 shows a second example, in which shown are a substrate 1, an electrode 2, a hole transporting layer 3, a light emitting layer 4, an electron injecting layer 5, a transparent electrode 6, an anti-reflection layer 15, and a moisture preventing layer 16.

Under conditions similar to those in the example 1 and on a chromium film constituting the electrode 2, a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of tin indium oxide (ITO) was formed by sputtering to obtain the transparent electrode 6. Then, on the transparent electrode 6, a film of silicon nitride (SiN) was formed by sputtering as the moisture preventing layer 16. Finally, on the moisture preventing layer 16, a film of $SiO_2$ was formed by sputtering as the anti-reflection film.

In this manner an organic luminescence device was prepared on the substrate 1, by forming the electrode 2, the hole-transporting layer 3, the light-emitting layer 4, the electron-injecting layer 5, the transparent electrode 6, the anti-reflection layer 15, and the moisture preventing layer 16.

Subsequently, a DC voltage was applied to the organic luminescence device in order to investigate the light emission characteristics thereof. As a result, it was confirmed that this device had an improved light-emitting efficiency in comparison with a device which is not provided with the anti-reflection layer 15 on the moisture preventing layer 16.

Example 3

FIG. 6 shows a third example, in which shown are a substrate 1, an electrode 22 which intercepts the external light, a hole transporting layer 3, a light emitting layer 4, an electron injecting layer 5, a transparent electrode 6, an anti-reflection layer 15, and a moisture preventing layer 16.

As the electrode 22 for intercepting the external light and preventing reflection of the external light, there may be employed an electrode utilizing a light-absorbing black material such as carbon, or an electrode capable of preventing reflection of the light entering the device from the exterior utilizing interference of light, as in a Black Layer technology (Luxell Inc.).

Thicknesses of the electrodes and the layers were determined in consideration of the light-emitting efficiency, so as to exhibit a visually desired display ability.

At first, on the substrate 1, a film of chromium was formed with a thickness of 200 nm by sputtering, and films of indium tin oxide (ITO) of a thickness of 62.1 nm and chromium of a thickness of 4.3 nm were formed thereon, thereby forming the electrode 9 capable of intercepting the external light and preventing the reflection thereof utilizing optical interference in three layers of chromium-ITO-chromium. Then, under conditions similar to those in the example 1 and on the electrode 9 capable of intercepting the external light and preventing reflection thereof, a film of αNPD was formed with a thickness of 50 nm as the hole-transporting layer 3, and a film of Alq3 was formed with a thickness of 50 nm as the light-emitting layer 4. Then, a film of aluminum-lithium was formed with a thickness of 1 nm as the electron-injecting layer 5. Thereafter, on the electron-injecting layer 5, a film of tin indium oxide (ITO) was formed with a thickness of 392 nm by sputtering to obtain the transparent electrode 6. Then, on the transparent electrode 6, a film of silicon nitride (SiN) was formed with a thickness of 1775 nm by sputtering as the moisture preventing layer 16. Finally, on the moisture preventing layer 16, a film of $SiO_2$ was formed with a thickness of 92.3 nm by sputtering as the anti-reflection film.

In this manner an organic luminescence device was prepared on the substrate 1, by forming the electrode 9 capable of intercepting the external light and preventing reflection thereof, the hole-transporting layer 3, the light-emitting layer 4, the electron-injecting layer 5, the transparent electrode 6, the anti-reflection layer 15, and the moisture preventing layer 16.

Then, reflectance was measured in case of introducing light (external light) into the organic luminescence device from a direction of the anti-reflection layer. As a result this device showed a reflectance of 1.6% or lower in a wavelength region of 450 to 650 nm. An organic luminescence device prepared for the purpose of comparison without the anti-reflection layer and subjected to the measurement of reflectance in a similar manner showed a reflectance as high as 10 to 15%.

Subsequently, a DC voltage was applied to the organic luminescence device in order to investigate the light emission characteristics thereof. As a result, it was confirmed, because the electrode at the substrate side was capable of intercepting the external light and preventing reflection thereof and the anti-reflection layer was provided on the moisture preventing layer, that this device showed a significant improvement in the contrast of light emission, in comparison with a device which is not provided with such layers.

Figure 7:
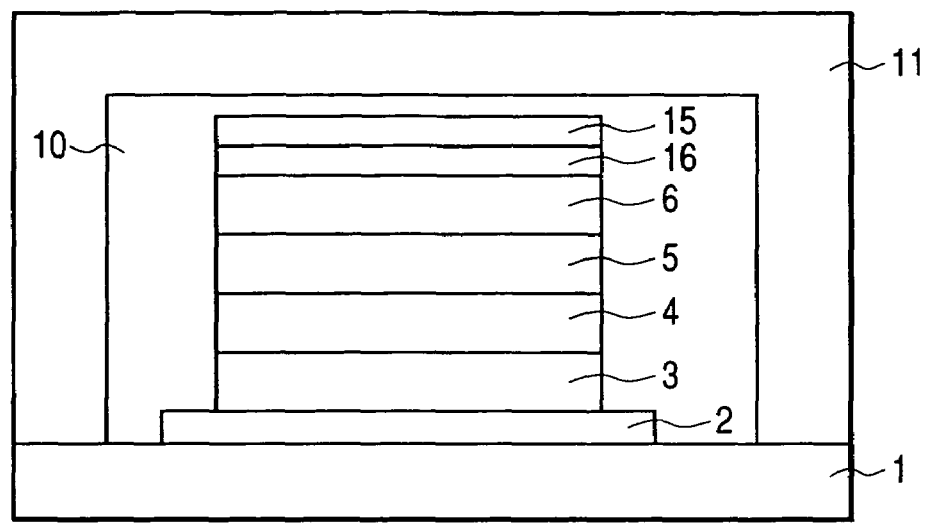
FIG. 7 is a schematic view showing a multilayer structure of an organic luminescence device of the present invention.

FIG. 7 shows another example having a transparent cover member, in which shown are an air layer 10 constituting a gaseous layer, and a cover glass 11 constituting a transparent cover member. The anti-reflection layer is formed by a $SiO_2$ layer of a refractive index 1.5, positioned between a passivation film (SiN) with a refractive index 2.1 and an air layer of a refractive index 1.0. In this example, the reflection of the external light is reduced by a large difference in the refractive index between the air layer and the passivation film (SiN), thereby improving the contrast of the organic luminescence device.

Formation of the anti-reflection layer according to the present invention allows to provide an organic luminescence device of a high efficiency, and an organic luminescence device of satisfactory contrast.

In the following there will be explained fourth to eighth embodiments and fourth to eighth examples.

These embodiments and examples provide an organic luminescence device array having a plurality of organic luminescence devices separated by isolation areas and each having a pair of mutually opposed electrodes and an organic compound layer formed between the paired electrodes, wherein the array includes, in the isolation area, an insulating member capable of intercepting the external light entering from the exterior of the device and preventing reflection of the external light, thereby preventing that the external light is reflected by a wiring provided under the organic luminescence device and in the isolation area and connected to the organic luminescence device, and by the surface of the insulating member in the isolation area.

Also there is provided an organic luminescence device array having a plurality of organic luminescence devices separated by isolation areas and each having a pair of mutually opposed electrodes and an organic compound layer formed between the paired electrodes, wherein the array includes a wiring connected to the organic luminescence device and a resinous member, provided under the organic luminescence device and between the organic luminescence device and the substrate, and the resinous member provided between the substrate and the organic luminescence device is formed as a member for intercepting the external light entering from the exterior of the device and preventing reflection of the external light, thereby preventing that the external light is reflected by the wiring provided under the organic luminescence device and in the isolation area and connected to the organic luminescence device, and by the surface of the insulating member provided between the substrate and the organic luminescence device.

Also the aforementioned member for intercepting the external light entering from the exterior of the device and preventing reflection of the external light is formed as a layer on the insulating member provided on the wiring and in the isolation area.

Also in the paired electrodes in each organic luminescence device, an electrode on the substrate side is formed as an electrode capable of preventing reflection of the external light entering from the exterior of the device, while the other electrode is formed as a transparent electrode, thereby preventing reflection of the external light entering the organic luminescence device array from the external environment in each organic luminescence device area and each isolation area in the organic luminescence device array.

Also a package, holding in a case an organic luminescence device array with anti-reflection for the external light entering from the external environment, does not require a polarizing layer for the purpose of anti-reflection of the external light, so that a compact and light package of satisfactory visibility of the displayed image for the organic luminescence device can be provided in a simple and inexpensive manner.

Fourth Embodiment

Figure 8:
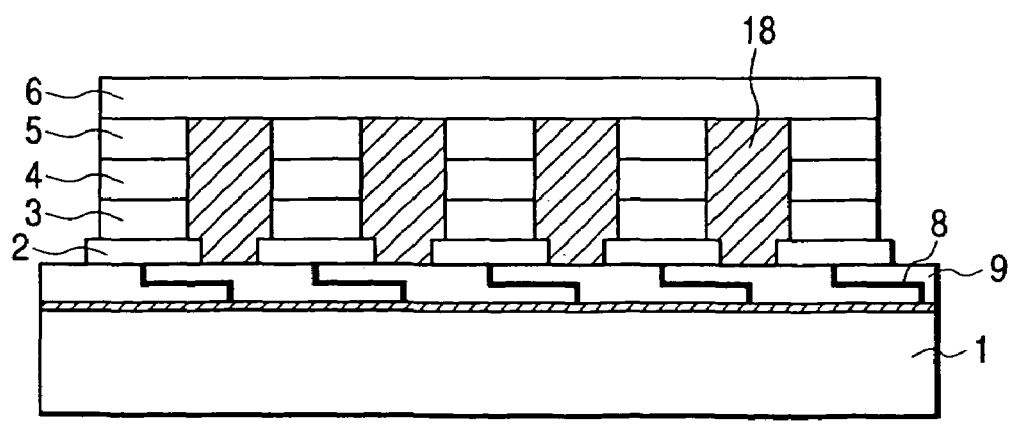
FIG. 8 is a schematic view showing a multilayer structure of an organic luminescence device of the present invention.

An organic luminescence device array according to a fourth embodiment of the present invention has a plurality of organic luminescence devices separated by isolation areas and each having a pair of mutually opposed electrodes and an organic compound layer formed between the paired electrodes, wherein the array includes a light intercepting member in the isolation area. FIG. 8 is a schematic view of an organic luminescence device array of the fourth embodiment of the present invention, in which provided are a substrate 1, an electrode 2, a hole transporting layer 3, a light emitting layer 4, an electron injecting layer 5, a transparent electrode 6, a wiring 8 connected to the electrode 2 of each organic luminescence device, a resinous member 9, and a member 18 for intercepting the external light entering from the exterior of the device and preventing reflection thereof, to constitute an organic luminescence device array of so-called top emission type.

Presence of the member 18 in each isolation area of the organic luminescence devices allows to prevent reflection of the external light, entering from the external environment of the organic luminescence device array, by the wiring provided under the organic luminescence device and in the isolation area and connected with the organic luminescence device, and the reflection of such external light by such member 18 is also prevented, whereby the organic luminescence device array provides an increased contrast and improves the visibility of the image displayed by such device.

In the present embodiment, a known insulating material can be selected for the member 18. For example, there can be utilized various black matrix materials employed in color filters for a liquid crystal display. Also the organic compound can be a known one, such as Alq3 or α-NPD. Also in the aforementioned organic luminescence device array, the organic luminescence devices may have light emissions of the same color or different colors.

Fifth Embodiment

An organic luminescence device array according to a fifth embodiment of the present invention has a plurality of organic luminescence devices separated by isolation areas and each having a pair of mutually opposed electrodes and an organic compound layer formed between the paired electrodes;

wherein a wiring connected with the organic luminescence device and a resinous member is provided under the organic luminescence device and between the organic luminescence device and the substrate, and the resinous member is formed as a member for intercepting the external light entering from the exterior of the device and preventing reflection of the external light.

Figure 9:
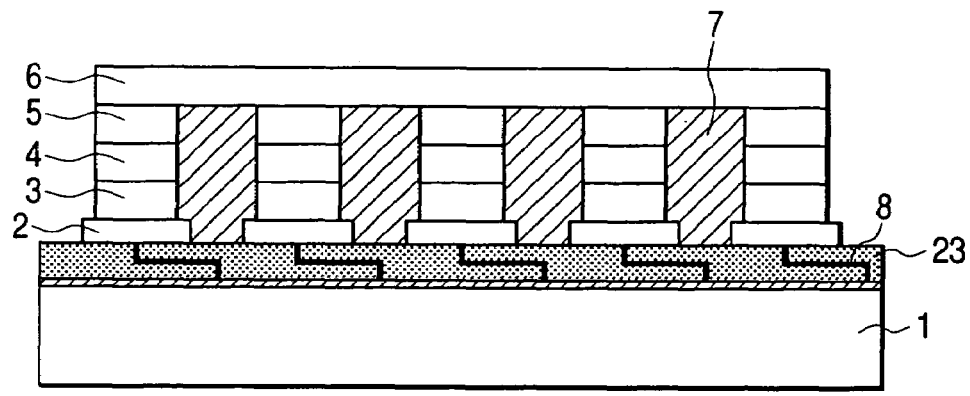
FIG. 9 is a schematic view showing a multilayer structure of an organic luminescence device of the present invention.

FIG. 9 is a schematic view showing the configuration of an organic luminescence device array of the fifth embodiment of the present invention, in which provided are a substrate 1, an electrode 2, a hole transporting layer 3, a light emitting layer 4, an electron injecting layer 5, a transparent electrode 6, an insulating member 7 provided in an isolation area present between the organic luminescence devices, a wiring 8 connected to the electrode 2 of each organic luminescence device, and a member 23 for intercepting the external light entering from the exterior of the device and preventing reflection thereof, to constitute an organic luminescence device array of so-called top emission type.

The resinous member present under each organic luminescence device and between the organic luminescence device and the substrate is formed as a member capable of intercepting the external light entering from the exterior of the device and preventing reflection of the external light, whereby the organic luminescence device array provides an increased contrast and improves the visibility of the image displayed by such device.

In the present embodiment, a known insulating material can be selected for the member 11. For example, there can be utilized various black matrix materials employed in color filters for a liquid crystal display. Also the insulating member 7 provided in the isolation area of the organic luminescence device in the organic luminescence device array can be a light transmissible member or an opaque member. Also the organic compound can be a known one, such as Alq3 or α-NPD.

Sixth Embodiment

An organic luminescence device array according to a sixth embodiment of the present invention has a plurality of organic luminescence devices separated by isolation areas and each having a pair of mutually opposed electrodes and an organic compound layer formed between the paired electrodes;

wherein, on an insulating member provided in the isolation area of the organic luminescence device, a member is provided for intercepting the external light entering from the exterior of the device and preventing reflection of the external light.

Figure 10:
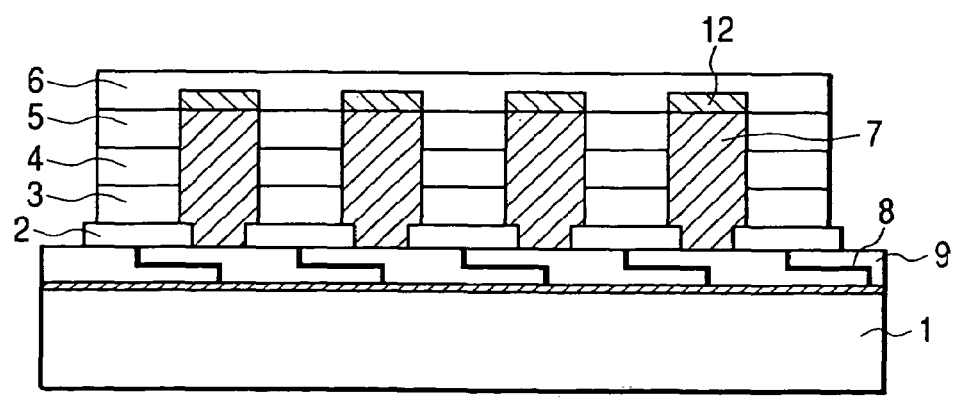
FIG. 10 is a schematic view showing a multilayer structure of an organic luminescence device of the present invention.

FIG. 10 is a schematic view showing the configuration of an organic luminescence device array of the sixth embodiment of the present invention, in which provided are a substrate 1, an electrode 2, a hole transporting layer 3, a light emitting layer 4, an electron injecting layer 5, a transparent electrode 6, an insulating member 7 provided in an isolation area present between the organic luminescence devices, a wiring 8 connected to the electrode 2 of each organic luminescence device, a resinous member 9, and a member 12 provided in the isolation area for intercepting the external light entering from the exterior of the device and preventing reflection thereof, to constitute an organic luminescence device array of so-called top emission type.

On the insulating member 7 provided in each isolation area of the organic luminescence devices, a member is provided for intercepting the external light entering from the exterior of the device and preventing reflection of the external light, whereby the organic luminescence device array provides an increased contrast and improves the visibility of the image displayed by such device.

In this embodiment, for the member 12, there can be utilized a metallic or resinous black matrix material employed in color filters for a liquid crystal display, a single-layer or multi-layer material of optical interference type, or a material of optical absorption type. Also the member 12 is only required to execute interception and prevention of reflection of the external light in the isolation area, and it may be positioned on the surface of the insulating member 7 or above the insulating member 7 and on the surface of the transparent electrode 6 in the isolation area. Further, in case the member 12 is a film of optical interference type and is provided on the surface of the insulating member 7 and below the transparent electrode 6, the prevention of reflection of the external light can be achieved also by utilizing the interference with the external light reflected on the surface of the transparent electrode 6. Also in such case, the insulating member 7 provided in each isolation area of the organic luminescence devices in the organic luminescence device array can be light transmissible or opaque. Also the organic compound can be a known one, such as Alq3 or α-NPD.

Seventh Embodiment

An organic luminescence device array according to a seventh embodiment of the present invention has a plurality of organic luminescence devices separated by isolation areas and each having a pair of mutually opposed electrodes and an organic compound layer formed between the paired electrodes, and is provided, in the isolation area, with means which intercepts the external light entering from the exterior of the device and prevents reflection of the external light;

wherein the paired electrodes in each organic luminescence device are constituted by an electrode positioned at the substrate side and capable of preventing reflection of the external light entering from the exterior of the device and a transparent electrode constituting the other electrode.

Figure 11:
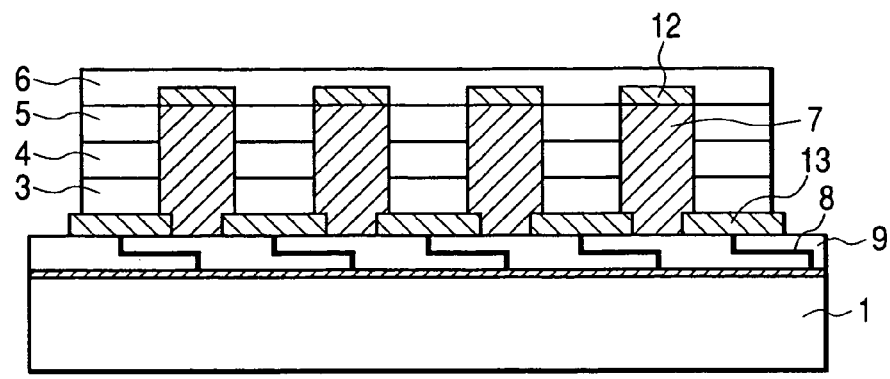
FIG. 11 is a schematic view showing a multilayer structure of an organic luminescence device of the present invention.

FIG. 11 is a schematic view showing the configuration of an organic luminescence device array of the seventh embodiment of the present invention, in which provided are a substrate 1, an electrode 13 provided at the side of the substrate in the organic luminescence device and capable of preventing reflection of the external light entering from the exterior of the device, a hole transporting layer 3, a light emitting layer 4, an electron injecting layer 5, a transparent electrode 6, an insulating member 7 provided in an isolation area present between the organic luminescence devices, a wiring 8 connected to the electrode 13 of each organic luminescence device, a resinous member 9, and a member 12 provided on the insulating member 7 in the isolation area for intercepting the external light entering from the exterior of the device and preventing reflection thereof, to constitute an organic luminescence device array of so-called top emission type.

In FIG. 11, a member for preventing reflection of the external light is provided on the insulating member in the isolation area of the organic luminescence devices, but such means for preventing the reflection of the external light is not restrictive, and there may also be applied the configuration of the fourth or fifth embodiment.

Since the electrode at the substrate side in each organic luminescence device and the isolation area of each organic luminescence device have anti-reflection means for the external light entering from the exterior of the device, the organic luminescence device array of this embodiment provides an increased contrast and improves the visibility of the image displayed by such device.

In the present embodiment, the anti-reflection method for the external light in the electrode 13 can be an optical absorption type or an optical interference type.

Eighth Embodiment

An eighth embodiment of the present invention provides an organic luminescence device package holding, in a case, an organic luminescence device array having a plurality of organic luminescence devices separated by isolation areas and each having a pair of mutually opposed electrodes and an organic compound layer formed between the paired electrodes;

wherein, the electrode at the substrate side in each organic luminescence device and the isolation area of each organic luminescence device have anti-reflection means for the external light entering from the exterior of the device, whereby the package holding such device in the case does not require a polarizing layer for the purpose of anti-reflection for the external light.

Figure 12:
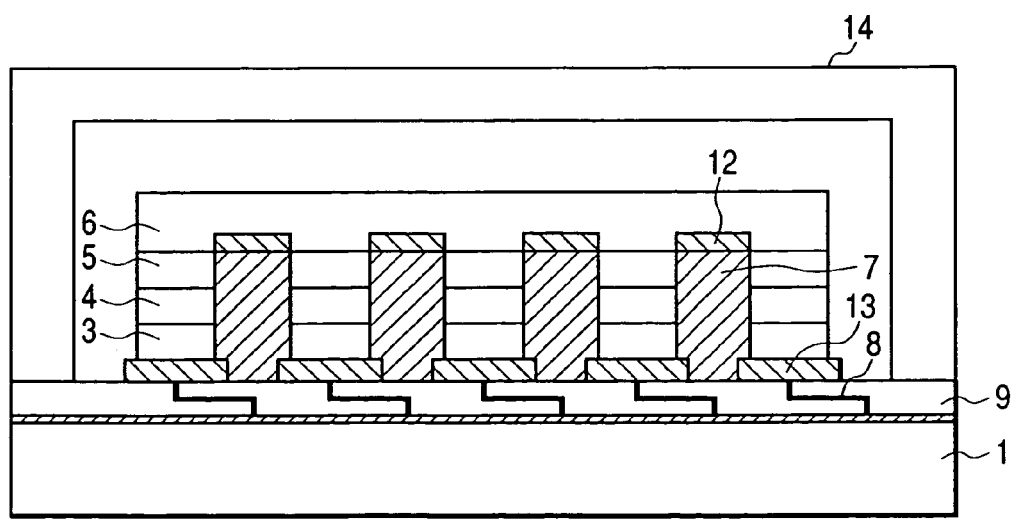
FIG. 12 is a schematic view-showing a multilayer structure of an organic luminescence device of the present invention.

FIG. 12 is a view showing the configuration of an organic luminescence device array package of the eighth embodiment of the present invention, in which provided are a substrate 1, an electrode 13 provided at the side of the substrate in the organic luminescence device and capable of preventing reflection of the external light entering from the exterior of the device, a hole transporting layer 3, a light emitting layer 4, an electron injecting layer 5, a transparent electrode 6, an insulating member 7 provided in an isolation area present between the organic luminescence devices, a wiring 8 connected to the electrode 13 of each organic luminescence device, a resinous member 9, a member 12 provided in the isolation area for intercepting the external light entering from the exterior of the device and preventing reflection thereof, and a case 14 to constitute an organic luminescence device array of so-called top emission type.

In this embodiment, since the electrode at the substrate side in each organic luminescence device and the isolation area of each organic luminescence device have anti-reflection means for the external light entering from the exterior of the device, the package holding such device in the case does not require a polarizing layer for the purpose of anti-reflection for the external light. Therefore, there can be provided a thin and light weight package for the organic luminescence device array with a high contrast and a high visibility of the displayed image. Also the manufacturing method is simple and is of a low cost.

In this embodiment, reflection of the external light on the surface of the case can be prevented by forming an anti-reflection layer on a face of the case 14, from which the light emission of the organic luminescence device array is emitted to the external environment. Such organic luminescence device array package can further improve the quality of the displayed image.

In any embodiment, the organic layer between the electrodes can be formed by a single layer as explained before or by plural layers such as a three-layer or five-layer structure. Also the organic luminescence device of the embodiment may be applied to a display apparatus capable of full-color display, constituted by light-emitting devices of RGB colors. More specifically, it may be applied to a display unit of a display device. The organic luminescence device of any of the embodiment may be applied, among such display devices, to a pixel unit (light-emitting unit) of a display panel of so-called active matrix drive, utilizing TFTs.

EXAMPLES

In the following, there will be explained, with reference to the accompanying drawings, preferred examples of the method for producing the organic luminescence device of the present invention, but the present invention is not limited by such examples.

Example 4

FIG. 8 shows a fourth example of the present invention, in which shown are a substrate 1, an electrode 2, a hole-transporting layer 3, a light emitting layer 4, an electron injecting layer 5, a transparent electrode 6, a wiring 8 connected to the electrode 2 of each organic luminescence device, a resinous member 9, and a member 18 for interception and anti-reflection of external light entering from the exterior of the device.

On the substrate 1, a chromium film was formed by sputtering and patterned into a predetermined dimension to form the wiring 8, and the substrate 1 was then coated with the resinous member 9. Then a chromium film was formed again on the substrate 1 by sputtering and patterned into a predetermined dimension to form the electrode 2. Then, in order to form a high resistance black matrix material in the isolation area of the organic luminescence device as the member 18 for interception and anti-reflection of the external light entering from the exterior of the device, a commercially available black matrix material was applied on the substrate 1, then subjected to pattern exposure, development and rinsing to form, in the isolation area, the member 18 for interception and anti-reflection for the external light. Then the substrate was subjected to UV/ozone washing, and a vacuum evaporation apparatus (manufactured by Shinku Kikou Co.) was used to form, on the substrate after washing, a film of αNPD having a hole transporting property and represented by the following chemical formula I

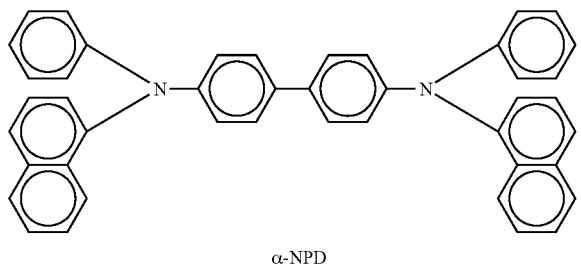

α-NPD by vacuum evaporation to form the hole-transporting layer 3. The film formation was conducted under a vacuum of $1.0 \times 10^{-6}$ Torr, and a film forming rate of 0.2-0.3 nm/sec. Then, on the hole-transporting layer 3, a film of an aluminum chelate (hereinafter called Alq3) represented by the following chemical formula:

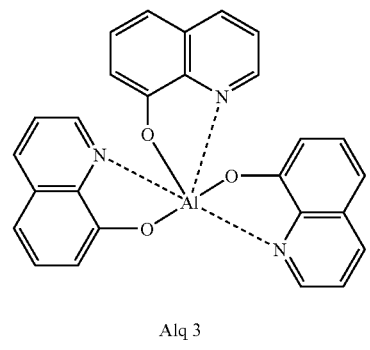

Alq 3 was formed by vacuum evaporation under the same conditions as those in the formation of the hole-transporting layer 3, thereby obtaining a light-emitting layer 4.

Then, on the light-emitting layer 4, a film of aluminum-lithium as the electron-injecting layer 5 was formed by vacuum evaporation under the same conditions as those in the formation of the hole-transporting layer 3. Thereafter, on the electron-injecting layer 5, a film of tin indium oxide (ITO) was formed by sputtering to obtain the transparent electrode 6. In this manner an organic luminescence device was prepared on the substrate 1, by forming the electrode 2, the hole-transporting layer 3, the light-emitting layer 4, the electron-injecting layer 5, the transparent electrode 6, the wiring 8, the resinous member 9 and the member 18.

Subsequently, a DC voltage was applied to the organic luminescence device under the condition where external light enters the organic luminescence device array from the external environment, in order to investigate the light emission characteristics thereof. As a result, it was confirmed that this organic luminescence device array had a higher contrast and an improved visibility of the displayed image, in comparison with a conventional organic luminescence device array which is not provided with the member 18 for interception and anti-reflection of the external light.

Example 5

FIG. 9 shows a fifth example, in which shown are a substrate 1, an electrode 2, a hole transporting layer 3, a light emitting layer 4, an electron injecting layer 5, a transparent electrode 6, an insulating member 7 provided in the isolation area present between the organic luminescence devices, a wiring 8 connected to the electrode 2 of each organic luminescence device, and a member 11 provided under the organic luminescence device and between the organic luminescence device and the substrate and serving for interception and anti-reflection of the external light entering from the exterior of the device.

Under conditions similar to those in the example 4, a chromium film was formed by sputtering and patterned into a predetermined dimension to form the wiring 8. Then, in order to form a high resistance black matrix material in the isolation area of the organic luminescence device as the member 11 for interception and anti-reflection of the external light entering from the exterior of the device, the substrate 1 was coated with a commercially available black matrix material, then subjected to pattern exposure, development and rinsing to form the member 11 for interception and anti-reflection for the external light, under the organic luminescence device and between the organic luminescence device and the substrate. Then a chromium film as the electrode 2 was formed again on the substrate 1 by sputtering and patterned into a predetermined dimension. Thereafter, in order to form the insulating member 7 in the isolation area of the organic luminescence device, the substrate 1 was coated with a commercial photoresist followed by pattern exposure, development and rinsing thereby forming the insulating member 7 in the isolation area. Then the substrate was subjected to UV/ozone washing, and a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of tin indium oxide (ITO) was formed by sputtering to obtain the transparent electrode 6, thereby completing an organic luminescence device.

Subsequently, a DC voltage was applied to the organic luminescence device under the condition where external light enters the organic luminescence device array from the external environment, in order to investigate the light emission characteristics thereof. As a result, it was confirmed that this organic luminescence device array had a higher contrast and an improved visibility of the displayed image, in comparison with a conventional organic luminescence device array which is not provided with the member 11 for interception and anti-reflection of the external light.

Example 6

FIG. 10 shows a sixth example, in which shown are a substrate 1, an electrode 2, a hole transporting layer 3, a light emitting layer 4, an electron injecting layer 5, a transparent electrode 6, an insulating member 7 provided in the isolation area present between the organic luminescence devices, a wiring 8 connected to the electrode 2 of each organic luminescence device, a resinous member 9, and a member 12 provided on the insulating member 7 in each isolation area for interception and anti-reflection of the external light entering from the exterior of the device.

Under conditions similar to those in the example 4, a chromium film was formed by sputtering and patterned into a predetermined dimension to form the wiring 8. Then, the substrate 1 was coated with the resinous member 9. Then a chromium film was formed again on the substrate 1 by sputtering and was patterned into a predetermined dimension to form the electrode 2. Thereafter, in order to form the insulating member 7 in the isolation area of the organic luminescence device, the substrate was coated with a commercial photoresist followed by pattern exposure, development and rinsing thereby forming the insulating member 7 in the isolation area. Then the member 12, for interception and anti-reflection for the external light entering from the exterior of the device by optical interference, was formed on the insulating member 7. The member 12 was so designed as to extinguish, by optical interference, also the reflection of the external light on the surface of the transparent electrode 6 to be formed later on the member 12. Then the substrate was subjected to UV/ozone washing, and a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of tin indium oxide (ITO) was formed by sputtering to obtain the transparent electrode 6, thereby completing an organic luminescence device array.

Subsequently, a DC voltage was applied to the organic luminescence device array in a situation where external light enters the organic luminescence device array from the external environment, in order to investigate the light emission characteristics thereof. As a result, it was confirmed that this organic luminescence device array had a higher contrast and an improved visibility of the displayed image, in comparison with a conventional organic luminescence device array which is not provided with the member 12 for interception and anti-reflection of the external light.

Example 7

FIG. 11 shows a seventh example, in which shown are a substrate 1, an electrode 13 provided at the substrate side of the organic luminescence device and capable of anti-reflection of the external light entering from the exterior of the device, a hole transporting layer 3, a light emitting layer 4, an electron injecting layer 5, a transparent electrode 6, an insulating member 7 provided in the isolation area present between the organic luminescence devices, a wiring 8 connected to the electrode 13 of each organic luminescence device, a resinous member 9, and a member 12 provided on the insulating member 7 in the isolation area for interception and anti-reflection of the external light entering from the exterior of the device.

The electrode 13 prevents, by optical absorption or optical interference, the reflection of the light entering the device from the exterior. For example, it may be formed by an electrode called Black Layer, capable of intercepting the external light and preventing reflection thereof by optical interference.

Under conditions similar to those in the example 4, a chromium film was formed by sputtering and patterned into a predetermined dimension to form the wiring 8. Then, the substrate 1 was coated with the resinous member 9. Then a chromium film, a indium tin oxide (ITO) film and a chromium film were formed again on the substrate 1 by sputtering and were patterned into a predetermined dimension to form the electrode 13, constituted by three layers of chromium-ITO-chromium and so-called Black Layer technology utilizing optical interference. Thereafter, in order to form the insulating member 7 in the isolation area of the organic luminescence device, the substrate 1 was coated with a commercial photoresist followed by pattern exposure, development and rinsing thereby forming the insulating member 7 in the isolation area. Then the member 12, for interception and anti-reflection for the external light entering from the exterior of the device by optical interference, was formed on the insulating member 7. The member 12 was so designed as to extinguish, by optical interference, also the reflection of the external light on the surface of the transparent electrode 6 to be formed later on the member 12. Then the substrate was subjected to UV/ozone washing, and a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of tin indium oxide (ITO) was formed by sputtering to obtain the transparent electrode 6, thereby completing an organic luminescence device array.

Subsequently, a DC voltage was applied to the organic luminescence device array under the condition where external light enters the organic luminescence device array from the external environment, in order to investigate the light emission characteristics thereof. As a result, it was confirmed that this organic luminescence device array had a higher contrast and an improved visibility of the displayed image, in comparison with a conventional organic luminescence device array which is not provided with the electrode 13 for interception and anti-reflection of the external light and the member 12 for interception and anti-reflection of the external light.

Example 8

FIG. 12 shows an eighth example, in which shown are a substrate 1, an electrode 13 provided at the substrate side of the organic luminescence device and capable of anti-reflection of the external light entering from the exterior of the device, a hole transporting layer 3, a light emitting layer 4, an electron injecting layer 5, a transparent electrode 6, an insulating member 7 provided in the isolation area present between the organic luminescence devices, a wiring 8 connected to the electrode 13 of each organic luminescence device, a resinous member 9, a member 12 provided on the insulating member 7 in the isolation area for interception and anti-reflection of the external light entering from the exterior of the device, and a case 14.

Under conditions similar to those in the example 4, a chromium film was formed by sputtering and patterned into a predetermined dimension to form the wiring 8. Then, the substrate 1 was coated with the resinous member 9. Then a chromium film, a indium tin oxide (ITO) film and a chromium film were formed again on the substrate 1 by sputtering and were patterned into a predetermined dimension to form the electrode 13, constituted by three layers of chromium-ITO-chromium and so-called Black Layer technology utilizing optical interference. Thereafter, in order to form the insulating member 7 in the isolation area of the organic luminescence device, the substrate 1 was coated with a commercial photoresist followed by pattern exposure, development and rinsing thereby forming the insulating member 7 in the isolation area. Then the member 12, for interception and anti-reflection for the external light entering from the exterior of the device by optical interference, was formed on the insulating member 7. The member 12 was so designed as to extinguish, by optical interference, also the reflection of the external light on the surface of the transparent electrode 6 to be formed later on the member 12. Then the substrate was subjected to UV/ozone washing, and a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of tin indium oxide (ITO) was formed by sputtering to obtain the transparent electrode 6, thereby completing an organic luminescence device array.

Then a glass case 14 was placed on the upper surface of the substrate so as to hold the organic luminescence device array, thereby obtaining an organic luminescence device array package. In such organic luminescence device array package, on a surface thereof where the light is emitted from the case 14, an anti-reflection layer was formed by alternately laminating $SiO_2$ and $TiO_2$ thin films by sputtering, thereby preventing the reflection of the external light on the case surface.

Subsequently, a DC voltage was applied to the organic luminescence device array under the condition where external light enters the organic luminescence device array from the external environment, in order to investigate the light emission characteristics thereof. As a result, it was confirmed that the visibility of the image displayed by this organic luminescence device array package was comparable to that in a conventional organic luminescence device array package which is provided with a polarizing layer on the package surface in order to prevent reflection of the external light entering the device from the external environment. Also, because of the absence of the polarizing layer, the organic luminescence device array package of the present invention was thinner and lighter than the conventional package, and was simpler and more inexpensive in the manufacture.

The present invention, by forming means for avoiding the influence of the external light, entering the organic luminescence device array from the external environment, allows to provide an organic luminescence device array with a high contrast and an improved visibility of the displayed image. There can also be provided an organic luminescence device package which is thin, light, simple in manufacture and inexpensive in cost.

In the following there will be explained ninth to thirteenth embodiments and ninth to thirteenth examples.

These embodiments and examples provide an organic luminescence package, formed by packaging an organic luminescence device, having at least a pair of mutually opposed electrodes and an organic compound layer formed between the paired electrodes, in a case, thereby protecting the organic luminescence layer from moisture and atmosphere in the external environment.

Thus, there is provided an organic luminescence device package of which the case is provided with an anti-reflection film on an entrance face for the light emitted from the organic luminescent layer (the entrance face means a face opposed to the luminescence device, among the faces defining the internal space of the case, on the light-emitting side; the expression "entrance face" on such light-emitting side being used for the purpose of distinguishing from a face on the external surface of the case, separated from the entrance face by the thickness of the case itself and thus constituting the rear surface of the entrance face).

Also the embodiments provide an organic luminescence device package further having an anti-reflection layer on the entrance face of the light emitted from the organic luminescence layer and on the transparent electrode of the organic luminescence layer.

Also the embodiments provide an organic luminescence device package in which, in a space contained in the case, a light transmissible resin is filled in a portion other than the organic luminescence device.

Also the embodiments provide an organic luminescence device package further having an anti-reflection layer, in the aforementioned case, on the entrance face of the light emitted from the organic luminescence layer, on the transparent electrode of the organic luminescence layer, and also, in the aforementioned case, on a face which is opposed to the entrance face of the light emitted from the organic luminescence layer and from which the light is emitted to the external environment.

Ninth Embodiment

Figure 13:
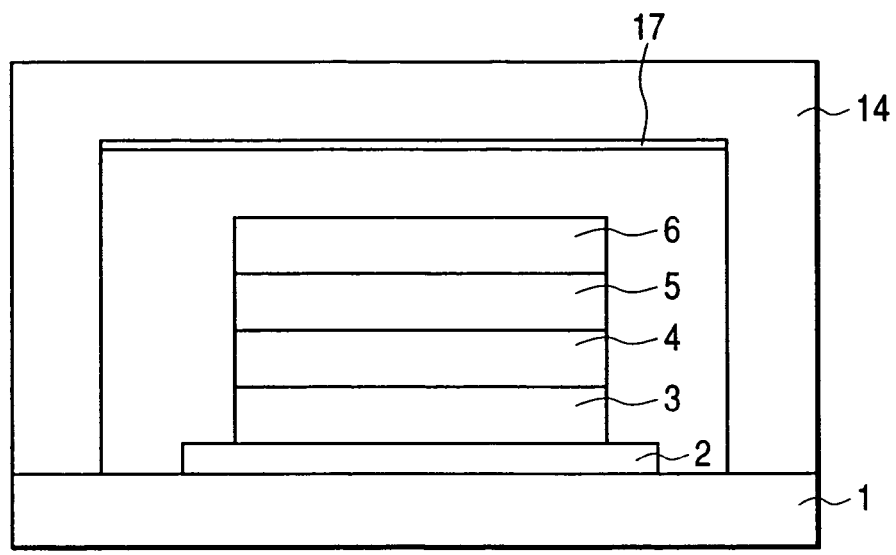
FIG. 13 is a schematic view showing a multilayer structure of an organic luminescence device of the present invention.

In a ninth embodiment of the present invention, an anti-reflection layer is provided on a transparent electrode 6 constituting a light-emitting electrode. FIG. 13 schematically shows a layered structure of an organic luminescence device package of the ninth embodiment of the present invention, in which shown are a substrate 1 (so-called base material, which can be a flexible member such as PET or an undeformable member such as glass and which can be light transmissible or opaque), an electrode 2, a hole transporting layer 3, a light emitting layer 4, an electron injecting layer 5, a transparent electrode 6, a case 14, and an anti-reflection layer 17 to constitute an organic luminescence device of so-called top emission type.

The organic luminescence device is constituted by the electrode 2 and the organic layer or hole-transporting layer 3, the light-emitting layer 4, the electron-injecting layer 5 and the transparent electrode 6.

The organic luminescence device is formed on the substrate, and is covered by the case 14 on the substrate, thus being held in an holding space of the case 14.

The light is emitted from the organic luminescence device and to the exterior of the organic luminescence device package through the case 14 which is a transparent member on an upper side of the drawing.

In the case, the side through which the light is emitted to the exterior is a light-emitting side. As shown in the drawing, the case is constituted by the light-emitting side and the pillar side for supporting the light-emitting side on the substrate.

In the light-emitting side, a face closer to the organic luminescence device is a light-emitting face, which constitutes a space holding the organic luminescence device. On the other hand, in the light-emitting side of the case 14, a face at the outer surface of the organic luminescence device package can be called the rear face of the light-emitting face.

The anti-reflection layer 17, provided in the holding space, prevents that the light emitted from the light-emitting layer 4 is reflected at the interface between an unrepresented atmospheric gas in the package (in the holding space) and the entrance face (light-emitting face) of the case 14, whereby the light-emitting efficiency of the device can be improved.

In this embodiment, the anti-reflection layer can be advantageously of a single layer type or a multi layer type. The organic compound can be a known one such as Alq3 or α-NPD.

Also in this embodiment, the organic layer between the electrodes can be formed by a single layer, or by plural layers such as a three-layer or five-layer structure. Also the organic luminescence device of the embodiment may be applied to a display apparatus capable of full-color display, constituted by light-emitting devices of RGB colors. More specifically, it may be applied to a display unit of a display device. The organic luminescence device of the embodiment may be applied, among such display devices, to a pixel unit (light-emitting unit) of a display panel of so-called active matrix drive, utilizing TFTs.

Tenth Embodiment

An organic luminescence device package of a tenth embodiment of the present invention is featured by having an anti-reflection layer in two locations, namely on the light-emitting face and on the transparent electrode of the organic luminescence device. In other aspects it is the same as the ninth embodiment.

More specifically, in an organic luminescence device package, formed by packaging an organic luminescence device, having at least a pair of mutually opposed electrodes and an organic compound layer formed between the paired electrodes, in a case, thereby protecting the organic luminescence layer from moisture and atmosphere in the external environment, an anti-reflection layer is provided in two locations on the entrance face of the light from the organic luminescence layer and on the transparent electrode of the organic luminescence layer.

Figure 14:
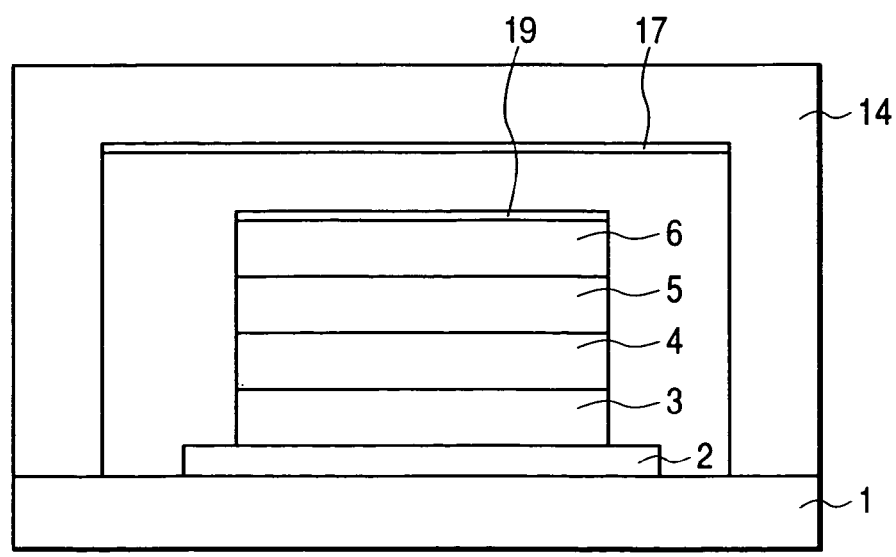
FIG. 14 is a schematic view showing a multilayer structure of an organic luminescence device of the present invention.

FIG. 14 schematically shows a layered structure of an organic luminescence device package of the tenth embodiment of the present invention, in which shown are a substrate 1, an electrode 2, a hole transporting layer 3, a light emitting layer 4, an electron injecting layer 5, a transparent electrode 6, a case 14, an anti-reflection layer 17 provided on the light entrance face of the case, and an anti-reflection layer 19 provided on the transparent electrode of the organic luminescence device, to constitute an organic luminescence device of so-called top emission type.

The anti-reflection layers in these two locations prevent the reflection of the light emitted from the light-emitting layer 4 at the interface between the atmospheric gas in the package and the entrance face of the case 14 and the interface between the atmospheric gas in the package and the transparent electrode 6, whereby the light-emitting efficiency of the device can be improved.

In the present embodiment, the anti-reflection layer can be advantageously of a single layer type or a multi layer type. The anti-reflection layer provided on the case 14 and that provided on the transparent electrode may be of the same material or of different materials.

Eleventh Embodiment

An organic luminescence device package of an eleventh embodiment of the present invention is featured in that a holding space of the case which is filled with a light transmissible resin, and that the light transmissible resin has a refractive index between those of a material constituting the case and of the transparent electrode. In other aspects it is the same as the ninth or tenth embodiment.

More specifically, in an organic luminescence device package, formed by packaging an organic luminescence device, having at least a pair of mutually opposed electrodes and an organic compound layer formed between the paired electrodes, in a case, thereby protecting the organic luminescence layer from moisture and atmosphere in the external environment, a light transmissible resin is filled in a space contained in the case and in a portion other than the organic luminescence device and such light transmissible resin is selected from a material of a refractive index between those of a material constituting the case and the transparent electrode.

Figure 15:
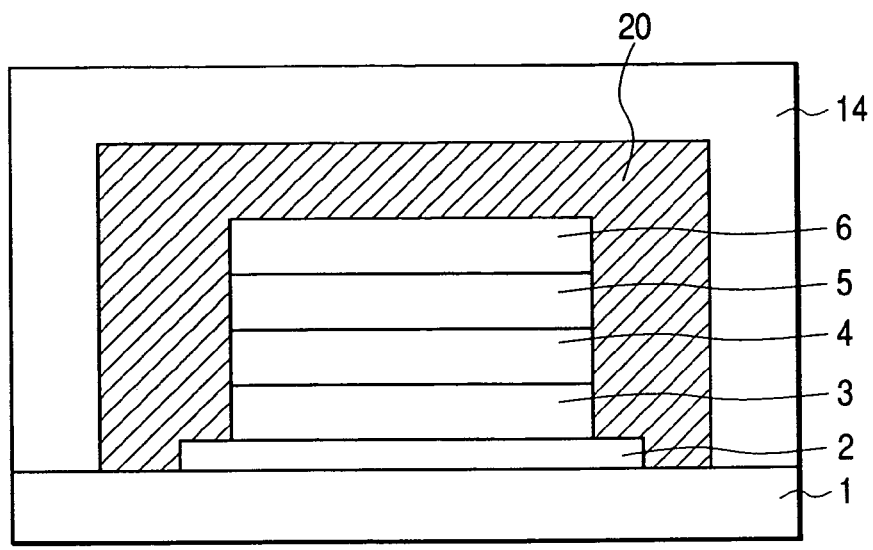
FIG. 15 is a schematic view showing a multilayer structure of an organic luminescence device of the present invention.

FIG. 15 schematically shows a layered structure of an organic luminescence device package of an eleventh embodiment of the present invention, in which shown are a substrate 1, an electrode 2, a hole transporting layer 3, a light emitting layer 4, an electron injecting layer 5, a transparent electrode 6, a case 14, and a light transmissible resin 20 filled in a space contained in the case and in a portion other than the organic luminescence device, to constitute an organic luminescence device of so-called top emission type.

Since the space other than the organic luminescence device within the holding space of the case is filled with the light transmissible resin of a refractive index positioned between those of the material constituting the case and of the transparent electrode, there can be reduced the interfacial reflections of the light emitted from the light-emitting layer 4 in emerging from the transparent electrode 6 and in entering the case 14, whereby the light-emitting efficiency of the device can be improved.

In the present embodiment, the light transmissible resin can be known one, such as epoxy or acrylic light transmissible resin.

Twelfth Embodiment

An organic luminescence device package of a twelfth embodiment of the present invention is featured by having an anti-reflection layer in three locations, namely on the light-emitting face of the case, on the transparent electrode of the organic luminescence device, and on the rear face of the light-emitting face at the light-emitting side of the case. In other aspects it is same as the ninth to eleventh embodiments.

More specifically, in an organic luminescence device package, formed by packaging an organic luminescence device, having at least a pair of mutually opposed electrodes and an organic compound layer formed between the paired electrodes, in a case, thereby protecting the organic luminescence layer from moisture and atmosphere in the external environment, an anti-reflection layer is provided in three locations on the entrance face of the light from the organic luminescence layer, on the transparent electrode of the organic luminescence layer, and on the emerging face of the light to the external environment in the case.

Figure 16:
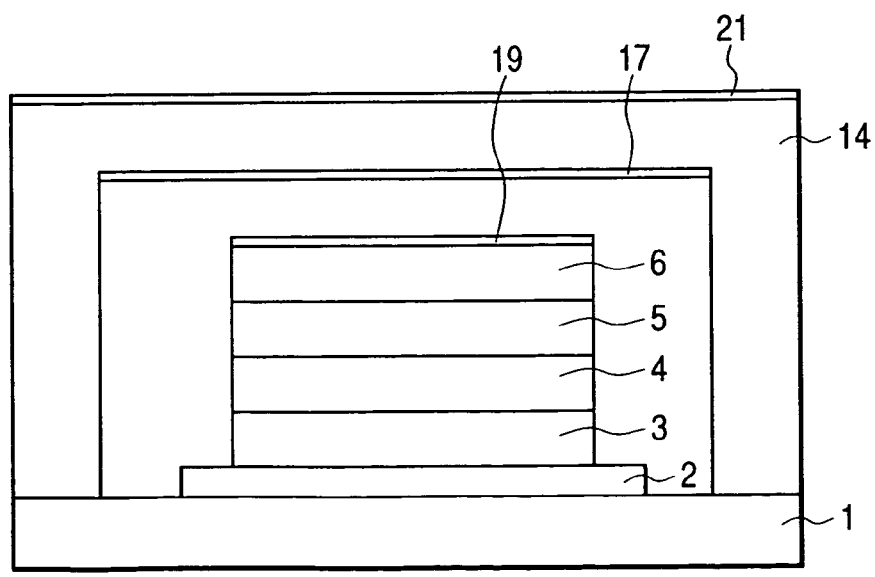
FIG. 16 is a schematic view showing a multilayer structure of an organic luminescence device of the present invention.

FIG. 16 schematically shows the twelfth embodiment of the present invention, in which shown are a substrate 1, an electrode 2, a hole transporting layer 3, a light emitting layer 4, an electron injecting layer 5, a transparent electrode 6, a case 14, an anti-reflection layer 17 provided on the light entrance face of the case, an anti-reflection layer 19 provided on the transparent electrode of the organic luminescence device, and an anti-reflection layer 21 provided on an emerging face of the case 14 for the light to the external environment, to constitute an organic luminescence device of so-called top emission type.

The anti-reflection layers in these three locations prevent the reflection of the light emitted from the light-emitting layer 4 at the interface between the atmospheric gas in the package and the entrance face of the case 14, at the interface between the atmospheric gas in the package and the transparent electrode 6, and the reflection of the external light entering the package from the external environment at the light-emerging face of the case, whereby the light-emitting efficiency of the device and the contrast of light emission can be improved.

The anti-reflection layers of three locations, namely those provided on two locations of the case 14 and that provided on the transparent electrode, may be of the same material or of different materials.

The light-emitting efficiency of the device in the foregoing embodiments can be estimated as follows, in the configurations shown in FIGS. 13 to 15.

Light reflection becomes larger and light transmission is lowered at an interface where the constituting materials thereof show a larger difference in the refractive indexes. More specifically, at the interface between the transparent electrode 6 and the space contained in the case, for an ITO transparent electrode with a refractive index n6=2.0 and a space of nitrogen or air with a refractive index nk=1, the reflectance is given by $(n6-nk)^2/(n6+nk)^2$ and corresponds to a reflection loss of about 11%. Also at the interface of the upper/lower face of the case 14 and the space, for the case 14 with a refractive index n7=1.45, the reflectance is given by $(n7-nk)^2/(n7+nk)^2$ and corresponds to a reflection loss of about 4%. Thus, even disregarding the reflection losses on other interfaces, the light emission is lost by about 19% in total. Thus, for improving the light-emission efficiency, it is necessary to suppress the reflection loss and to improve the transmittance of light emitted from the light emitting layer 4 to the upper space through the case 14.

An anti-reflection film is effective for suppressing the reflection loss. A known anti-reflection film utilizes a transparent material having a large refractive index such as ZnS, $CeO_2$ or $TiO_2$ and a material having a small refractive index such as LiF, $CaF_2$, $MgF_2$ or $SiO_2$ and is formed by alternately laminating the material having a larger refractive index and the material having a smaller refractive index (with mutually different refractive indexes) with each thickness obtained by dividing a design wavelength with (4×refractive index of material). In such configuration, it is necessary to employ a material having a refractive index smaller than that of a material constituting the interface, as the material of the smaller refractive index in the anti-reflection film. For example, a three-pair anti-reflection film employing NaF or LiF (smaller refractive index) and $TiO_2$ (larger refractive index) (for example, case surface/LiF/ $TiO_2$/LiF/$TiO_2$/LiF/$TiO_2$) allows to reduce the above-mentioned interfacial reflection loss to 1/10 or less. In case the anti-reflection film 15 has a single layer structure, there is selected a material having a refractive index lower than that of the material constituting the layer of which reflection loss is to be suppressed.

In the configuration shown in FIG. 15, the presence of the light transmissible resin 20 (for example with a refractive index n10=1.65) can reduce the reflection loss of the emitted light at the case 14. The reflectance is represented by $(n10-n7)^2/(n10+n7)^2$ which corresponds to a reflection of about 1%, which is about ¼ in comparison with a case without the light transmissible resin 20. Also the emitted light is reflected upon emerging from the transparent electrode 6 to the space of the case 14, thus returning to the device. The reflectance is represented by $(n6-nk)^2/(n6+nk)^2$ corresponding to a reflection of about 11%. This reflected light is reflected by the electrode 2 and emitted again, but, unless the electrode 2 has a high reflectance, it is absorbed by the electrode 2 to result in a loss. Also in this case, the presence of the light transmissible resin 20 (for example with a refractive index n10=1.65) reduces the reflection at the interface with the transparent electrode 6, represented by $(n6-nk)^2/(n6+nk)^2$, to about 0.9%. In this manner, the presence of the light transmissible resin 20 significantly reduces the interfacial reflections.

A contrast of a device can be evaluated by the following formula:

$$C=1+B/(\gamma \times A)$$

wherein C is a contrast evaluation value, A is luminosity (ft-L) of external light, B is luminosity (ft-L) of the device, and γ is reflectance (%) of the entire device.

It is therefore necessary to observe the device in a darker place (A) with a lowered reflectance (γ) and with a higher luminosity (B).

In practice, a difficulty may arise in an outdoor use. The luminosity of the external light may become several to ten and several times of that of the device.

The reflection loss, which lowers the transmission, also reduces the contrast. In the absence of the aforementioned anti-reflection film, because of a reflection of the external light of about 19%, the contrast value becomes 10 or less even under the external light of a luminosity comparable to that of the device. On the other hand, the presence of the aforementioned anti-reflection film, capable of reducing the reflection of the external light to about 1%, can provide a satisfactory contrast value close to 100. However, in case the electrode 2 has a high reflectance (for example 20% or higher), a sufficient improvement in contrast cannot be attained by the reflection of the external light by the electrode 2.

Thirteenth Embodiment

An organic luminescence device package of a thirteenth embodiment of the present invention is featured in that, in the aforementioned mutually opposed electrodes, an electrode provided at the substrate side is formed-by an electrode capable of interception and anti-reflection of the external light while the other electrode is formed as a transparent electrode. In other aspects it is the same as the ninth or twelfth embodiment.

Figure 17:
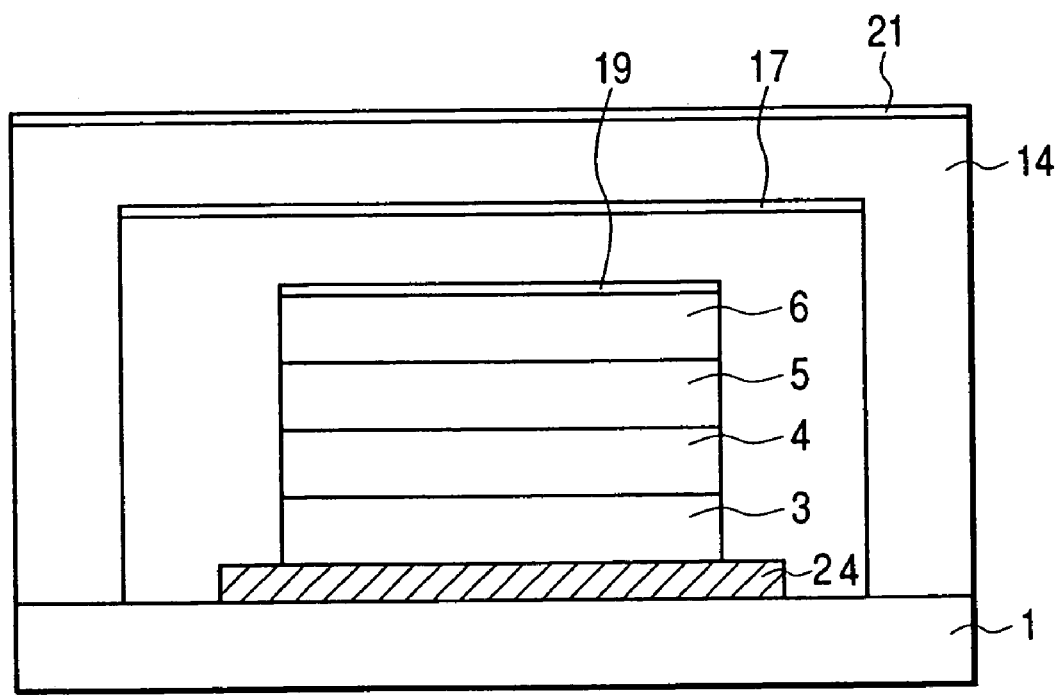
FIG. 17 is a schematic view showing a multilayer structure of an organic luminescence device of the present invention.

FIG. 17 shows a thirteenth embodiment of the present invention, showing an example of applying the configuration of the thirteenth embodiment to the configuration of the twelfth embodiment of the present invention. The thirteenth embodiment of the present invention is advantageously applicable to any of the ninth to eleventh embodiments.

In FIG. 17, there are shown a substrate 1, an electrode 24 capable of interception and anti-reflection for the external light, a hole transporting layer 3, a light emitting layer 4, an electron injecting layer 5, a transparent electrode 6, a case 14, an anti-reflection layer 17 provided on the entrance face of the case 14 for the light from the light-emitting layer 4, an anti-reflection layer 19 provided on the transparent electrode 6, and an anti-reflection layer 21 provided on an emerging face of the case 14 for the light to the external environment, to constitute an organic luminescence device of so-called top emission type.

In the aforementioned organic luminescence device, the electrode provided at the substrate side is formed as an electrode capable of interception and anti-reflection of the external light, thereby preventing the reflection of the external light at the electrode provided at the substrate side, thus improving the contrast of the light emission.

In the electrode provided at the substrate side, the interception and anti-reflection for the external light may be achieved by an optical absorption system or an optical interference system.

The anti-reflection layers of three locations, namely those provided on two locations of the case 14 and that provided on the transparent electrode, may be of the same material or of different materials.

EXAMPLES

In the following, there will be explained, with reference to the accompanying drawings, preferred examples of the method for producing the organic luminescence device of the present invention, but the present invention is not limited by such examples.

Example 9

FIG. 13 shows a ninth example of the present invention, in which shown are a substrate 1, an electrode 2, a hole transporting layer 3, a light emitting layer 4, an electron injecting layer 5, a transparent electrode 6, a case 14, and an anti-reflection layer 17.

On the substrate 1, a chromium film was formed by sputtering to obtain the electrode 2. Then the substrate was subjected to ultrasonic rinsing in succession with acetone and isopropyl alcohol (IPA), then washed by boiling in IPA and dried. It was further subjected to UV/ozone washing.

Then a vacuum evaporation apparatus (manufactured by Shinku Kikou Co.) was used to form, on the substrate after washing, a film of αNPD having a hole transporting property and represented by the following chemical formula I

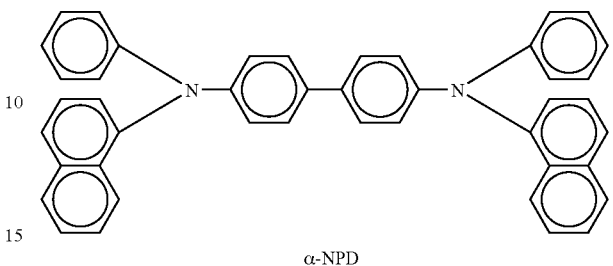

α-NPD by vacuum evaporation to form the hole-transporting layer 3. The film formation was conducted under a vacuum of $1.0 \times 10^{-6}$ Torr, and a film forming rate of 0.2-0.3 nm/sec. Then, on the hole-transporting layer 3, a film of an aluminum chelate (hereinafter called Alq3) represented by the following chemical formula:

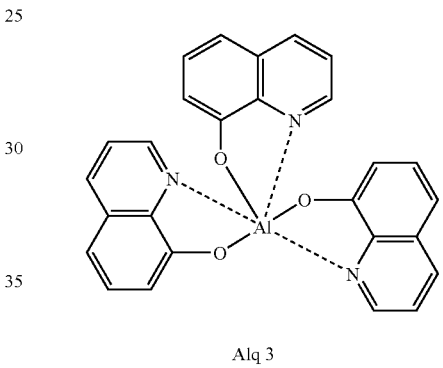

Alq 3 was formed by vacuum evaporation under the same conditions as those in the formation of the hole-transporting layer 3, thereby obtaining a light-emitting layer 4. Then, on the light-emitting layer 4, a film of aluminum-lithium as the electron-injecting layer 5 was formed by vacuum evaporation under the same conditions as those in the formation of the hole-transporting layer 3. Thereafter, on the electron-injecting layer 5, a film of tin indium oxide (ITO) was formed by sputtering to obtain the transparent electrode 6. In this manner an organic luminescence device was prepared on the substrate 1, by forming the electrode 2, the hole-transporting layer 3, the light-emitting layer 4, the electron-injecting layer 5, the transparent electrode 6, and the anti-reflection layer.

Then, on an entrance face of a glass case 14, receiving the light emission from the light-emitting layer 4, the anti-reflection layer 17 was formed by alternately laminating $SiO_2$ and $TiO_2$ thin films by sputtering.

Then the case having the anti-reflection layer 17 was placed on the upper surface of the substrate so as to hold the organic luminescence device array, thereby obtaining an organic luminescence device package.

Subsequently, a DC voltage was applied to the organic luminescence device package, in order to investigate the light emission characteristics thereof. As a result, it was confirmed that the light-emitting efficiency was improved in comparison with an organic luminescence device package without the anti-reflection layer 17.

Example 10

FIG. 14 shows a tenth example, in which shown are a substrate 1, an electrode 2, a hole transporting layer 3, a light emitting layer 4, an electron injecting layer 5, a transparent electrode 6, a case 14, an anti-reflection layer 17, and an anti-reflection layer 19 provided on the transparent electrode 6 of the organic luminescence device.

Under conditions similar to those in the example 9, a chromium film constituting the electrode 2 was formed by sputtering, then a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting-layer 5, a film of indium tin oxide (ITO) was formed by sputtering to obtain the transparent electrode 6. Then, on the transparent electrode 6, thin films of $SiO_2$ and $TiO_2$ were alternately laminated by sputtering to form the anti-reflection film, thereby completing the organic luminescence device.

Then the glass case, having the anti-reflection layer 17 on the entrance face for the light emission from the light-emitting layer 4, was placed on the upper surface of the substrate so as to hold the organic luminescence device, thereby obtaining an organic luminescence device package.

Subsequently, a DC voltage was applied to the organic luminescence device package, in order to investigate the light emission characteristics thereof. As a result, it was confirmed that the light-emitting efficiency was improved in comparison with an organic luminescence device package without the anti-reflection layers 17 and 19.

Example 11

FIG. 15 shows an eleventh example, in which shown are a substrate 1, an electrode 2, a hole transporting layer 3, a light emitting layer 4, an electron injecting layer 5, a transparent electrode 6, a case 14, and a light transmissible resin 20.

Under conditions similar to those in the example 9, a chromium film constituting the electrode 2 was formed by sputtering, then a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of indium tin oxide (ITO) was formed by sputtering to obtain the transparent electrode 6. Then the glass case, having the anti-reflection layer 17 on the entrance face for the light emission from the light-emitting layer 4, was placed on the upper surface of the substrate so as to hold the organic luminescence device, thereby obtaining an organic luminescence-device package.

Subsequently, a DC voltage was applied to the organic luminescence device package, in order to investigate the light emission characteristics thereof. As a result, it was confirmed that the light-emitting efficiency was improved in comparison with a conventional organic luminescence device package in which the space other than the organic luminescence device was not filled with the light transmissible resin.

Example 12

FIG. 16 shows a twelfth example, in which shown are a substrate 1, an electrode 2, a hole transporting layer 3, a light emitting layer 4, an electron injecting layer 5, a transparent electrode 6, a case 14, an anti-reflection layer 17 provided on the entrance face of the case 14 for the light from the light-emitting layer 4, an anti-reflection layer 19 provided on the transparent electrode 6, and an anti-reflection layer 21 provided on an exit face of the case 14 for the light emerging to the external environment.

Under conditions similar to those in the example 9, a chromium film constituting the electrode 2 was formed by sputtering, then a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of indium tin oxide (ITO) was formed by sputtering to obtain the transparent electrode 6. Then, on the transparent electrode 6, thin films of $SiO_2$ and $TiO_2$ were alternately laminated by sputtering to form the anti-reflection film, thereby completing the organic luminescence device.

Then the glass case, having the anti-reflection layers 17 and 19 formed by alternately laminating $SiO_2$ and $TiO_2$ thin films by sputtering on the entrance face for the light emitted from the light-emitting layer 4 and on the exit face for the light emission from the case to the external environment, was placed on the upper surface of the substrate so as to hold the organic luminescence device, thereby obtaining an organic luminescence device package.

Subsequently, a DC voltage was applied to the organic luminescence device package, in order to investigate the light emission characteristics thereof. As a result, it was confirmed that the light-emitting efficiency and the contrast of the organic luminescence device were significantly improved in comparison with an organic luminescence device package without the anti-reflection layers 17, 19 and 21.

Example 13

FIG. 17 shows a thirteenth example, in which the configuration of the thirteenth example is applied to the configuration of the twelfth example of the present invention. The thirteenth example of the present invention is advantageously applicable to any of the ninth to eleventh examples.

In FIG. 17, there are shown a substrate 1, an electrode 24 capable of interception and anti-reflection for the external light, a hole transporting layer 3, a light emitting layer 4, an electron injecting layer 5, a transparent electrode 6, a case 14, an anti-reflection layer 17 provided on the entrance face of the case 14 for the light from the light-emitting layer 4, an anti-reflection layer 19 provided on the transparent electrode 6, and an anti-reflection layer 21 provided on an emerging face of the case 14 for the light to the external environment.

The electrode 24 with interception and anti-reflection of the external light prevents, by optical absorption or optical interference, the reflection of the light entering the device from the exterior. For example, it may be formed by an electrode called Black Layer, capable of intercepting the external light and preventing reflection thereof by optical interference.

Under conditions similar to those in the example 1, a chromium film, a indium tin oxide (ITO) film and a chromium film were formed on the substrate 1 by sputtering and were patterned into a predetermined dimension to form the electrode 24, constituted by three layers of chromium-ITO-chromium and so-called Black Layer technology utilizing optical interference. Thereafter, the substrate was subjected to UV/ozone washing, and a film of αNPD was formed as the hole-transporting layer 3, and a film of Alq3 was formed as the light-emitting layer 4. Then, a film of aluminum-lithium was formed as the electron-injecting layer 5. Thereafter, on the electron-injecting layer 5, a film of indium tin oxide (ITO) was formed by sputtering to obtain the transparent electrode 6. Then, on the transparent electrode 6, $SiO_2$ and $TiO_2$ thin films were alternately laminated by sputtering to form the anti-reflection layer 9 thereby completing an organic luminescence device.

Then the glass case, having the anti-reflection layers 17 and 9 formed by alternately laminating $SiO_2$ and $TiO_2$ thin films by sputtering on the entrance face for the light emitted from the light-emitting layer 4 and on the exit face for the light emission from the case 14 to the external environment, was placed on the upper surface of the substrate so as to hold the organic luminescence device, thereby obtaining an organic luminescence device package.

Subsequently, a DC voltage was applied to the organic luminescence device package, in order to investigate the light emission characteristics thereof. As a result, it was confirmed that the light-emitting efficiency and the contrast of the organic luminescence device were significantly improved in comparison with a conventional organic luminescence device package without the anti-reflection layers 17, 19 and 21, and without the electrode 24 with interception and anti-reflection of the external light.

The anti-reflection layer of the present invention allows to provide an organic luminescence device of a high efficiency and an organic luminescence device of a satisfactory contrast.

As explained by the first to thirteenth embodiments and the first to thirteenth examples in the foregoing, the presence of the anti-reflection layer allows to provide an organic luminescence device, an organic luminescence device array and an organic luminescence device package of a high efficiency and a satisfactory contrast.

What is claimed is:

1. A top-emission organic luminescence device having a light-emitting layer comprising:
   (a) a pair of mutually opposed electrodes, wherein said pair of electrodes are a first electrode provided on a substrate and a transparent second electrode disposed farther from said substrate than said first electrode;
   (b) an anti-reflection layer provided on said transparent second electrode and in contact therewith at an interface therebetween, wherein the anti-reflection layer has a refractive index less than the transparent second electrode, and a side of the anti-reflection layer opposite to the interface is in contact with an external environment, and the thickness of said anti-reflection layer satisfies the following equation:

$$d=\lambda/4n$$

where d represents the thickness of said anti-reflection layer, $\lambda$ represents a wavelength of light emitted from the light-emitting layer, and n represents the refractive index of said anti-reflection layer and
   (c) an organic light-emitting layer formed between said pair of electrodes, wherein the reflection of the light emitted from the light-emitting layer at the interface of the side of the transparent second electrode opposite to the organic light emitting layer is prevented by said anti-reflection layer.

2. The organic luminescence device according to claim 1, wherein said first electrode provided on the substrate side is capable of intercepting external light and preventing reflection of external light.

3. The organic luminescence device according to claim 1, wherein the anti-reflection layer is a single layer.

4. The organic luminescence device according to claim 1, wherein the anti-reflection layer is multi-layers.

5. The top-emission organic luminescence device according to claim 1, wherein said transparent second electrode is composed of indium tin oxide.

6. A top-emission organic luminescence device comprising:
   (a) a pair of mutually opposed electrodes, wherein said pair of electrodes are a first electrode provided on a substrate and a transparent second electrode, disposed farther from the substrate than said first electrode;
   (b) a moisture prevention layer provided on said transparent second electrode;
   (c) an anti-reflection layer provided on said moisture prevention layer forming an interface therebetween, wherein a side of the anti-reflection layer opposite to the interface is in contact with an external environment, and the thickness of said anti-reflection layer satisfies the following equation:

$$d=\lambda/4n$$

where d represents the thickness of said anti-reflection layer, $\lambda$ represents a wavelength of light emitted from the light-emitting layer, and n represents the refractive index of said anti-reflection layer; and
   (d) a light-emitting organic layer formed between said pair of electrodes, whereby emitted light is transmitted through the transparent second electrode to the external environment; wherein the reflection of the light emitted from the light-emitting layer at the interface of the side of the moisture prevention layer opposite to the transparent second electrode is prevented by said anti-reflection layer.

7. The organic luminescence device according to claim 6, wherein said first electrode provided on the substrate side is capable of intercepting external light and preventing reflection of external light.

8. The organic luminescence device according to claim 6, wherein the anti-reflection layer has a refractive index less than the moisture prevention layer.

9. The organic luminescence device according to claim 6, wherein the anti-reflection layer is a single layer.

10. The organic luminescence device e according to claim 6, wherein the anti-reflection layer is multi-layers.

11. The top-emission organic luminescence device according to claim 6, wherein said transparent second electrode is composed of indium tin oxide.

12. The top-emission organic luminescence device according to claim 6, wherein said moisture prevention layer is composed of SiN.

13. A top-emission organic luminescence device comprising in this order:
   (a) a substrate;
   (b) a first electrode;
   (c) a light-emitting organic layer;
   (d) a transparent second electrode;
   (e) a layer of silicon nitride;
   (f) a layer of silicon oxide provided on the layer of silicon nitride and in contact therewith at an interface therebetween, wherein a side of the layer of silicon oxide opposite to the interface is in contact with an external environment.

* * * * *

UNITED STATES PATENT AND TRADEMARK OFFICE
CERTIFICATE OF CORRECTION

PATENT NO.      : 7,332,859 B2                                        Page 1 of 1
APPLICATION NO. : 11/231851
DATED           : February 19, 2008
INVENTOR(S)     : Toshinori Hasegawa et al.

It is certified that error appears in the above-identified patent and that said Letters Patent is hereby corrected as shown below:

ON THE TITLE PAGE [56] REFERENCES CITED:

Foreign Patent Documents, "2002/076884" should read --2001/076884--.

COLUMN 30:

Line 45, "e" should be deleted.

Signed and Sealed this

Fourteenth Day of October, 2008

JON W. DUDAS
*Director of the United States Patent and Trademark Office*